(12) United States Patent
Lee et al.

(10) Patent No.: US 12,363,974 B2
(45) Date of Patent: Jul. 15, 2025

(54) GATE STRUCTURE OF SEMICONDUCTOR DEVICE AND METHOD OF FORMING SAME

(71) Applicant: Taiwan Semiconductor Manufacturing Co., Ltd., Hsinchu (TW)

(72) Inventors: Hsin-Yi Lee, Hsinchu (TW); Weng Chang, Hsinchu (TW); Chi On Chui, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 421 days.

(21) Appl. No.: 17/662,685

(22) Filed: May 10, 2022

(65) Prior Publication Data
US 2023/0207663 A1    Jun. 29, 2023

Related U.S. Application Data

(60) Provisional application No. 63/266,110, filed on Dec. 29, 2021.

(51) Int. Cl.
*H10D 64/01* (2025.01)
*H10D 30/01* (2025.01)
(Continued)

(52) U.S. Cl.
CPC ......... *H10D 64/017* (2025.01); *H10D 30/024* (2025.01); *H10D 30/031* (2025.01);
(Continued)

(58) Field of Classification Search
CPC .. H10D 64/021; H10D 64/667; H10D 64/691; H10D 30/024; H10D 84/0144; H01L 21/02337
See application file for complete search history.

(56) References Cited

U.S. PATENT DOCUMENTS 9,647,071 B2    5/2017  Peng et al.
10,854,459 B2 *  12/2020  Wei ................... H01L 21/02321
(Continued)

FOREIGN PATENT DOCUMENTS

CN    104795362 A    7/2015
CN    113764411 A    12/2021
(Continued)

OTHER PUBLICATIONS

A. Fet, V. Häublein, A. J. Bauer, H. Ryssel, L. Frey; Effective work function tuning in high-k dielectric metal-oxide-semiconductor stacks by fluorine and lanthanide doping. Appl. Phys. Lett. Feb. 1, 2010; 96 (5): 053506. https://doi.org/10.1063/1.3303976 (Year: 2010).*

*Primary Examiner* — Alia Sabur
(74) *Attorney, Agent, or Firm* — Slater Matsil, LLP

(57) ABSTRACT

A semiconductor device and a method of forming the same are provided. The method includes forming a fin extending from a substrate. A dummy gate is formed over the fin. The dummy gate extends along sidewalls and a top surface of the fin. The dummy gate is removed to form a recess. A replacement gate is formed in the recess. Forming the replacement gate includes forming an interfacial layer along sidewalls and a bottom of the recess. A dipole layer is formed over the interfacial layer. The dipole layer includes metal atoms. Fluorine atoms are incorporated in the dipole layer. The fluorine atoms and the metal atoms are driven from the dipole layer into the interfacial layer. The dipole layer is removed.

20 Claims, 28 Drawing Sheets

(51) Int. Cl.
*H10D 30/62* (2025.01)
*H10D 30/67* (2025.01)
*H10D 62/10* (2025.01)
*H10D 64/66* (2025.01)
*H10D 64/68* (2025.01)

(52) U.S. Cl.
CPC ..... *H10D 30/6211* (2025.01); *H10D 30/6735* (2025.01); *H10D 30/6739* (2025.01); *H10D 30/6757* (2025.01); *H10D 62/118* (2025.01); *H10D 64/01* (2025.01); *H10D 64/021* (2025.01); *H10D 64/667* (2025.01); *H10D 64/691* (2025.01)

(56) References Cited

U.S. PATENT DOCUMENTS

| | | |
|---|---|---|
| 2010/0248464 A1 | 9/2010 | Clark |
| 2012/0129330 A1* | 5/2012 | Kim ................. H01L 21/28176 438/591 |
| 2015/0311127 A1 | 10/2015 | Jagannathan et al. |
| 2016/0365414 A1 | 12/2016 | Peng et al. |
| 2017/0170027 A1* | 6/2017 | Hou ....................... H01L 21/324 |
| 2019/0035916 A1 | 1/2019 | Chiu et al. |
| 2020/0088498 A1* | 3/2020 | Kenney ..................... F41G 3/08 |
| 2020/0098640 A1* | 3/2020 | Savant ................. H10D 30/024 |
| 2020/0119164 A1* | 4/2020 | Tsau ................. H01L 21/28185 |
| 2020/0135887 A1* | 4/2020 | Wu ..................... H10D 84/0193 |
| 2021/0036127 A1 | 2/2021 | Lin et al. |
| 2021/0175070 A1* | 6/2021 | Cheng .............. H01L 21/02362 |
| 2022/0052162 A1 | 2/2022 | Lee et al. |

FOREIGN PATENT DOCUMENTS

| | | |
|---|---|---|
| KR | 20110123809 A | 11/2011 |
| KR | 20190013403 A | 2/2019 |
| TW | 201442238 A | 11/2014 |
| WO | 2010111453 A1 | 9/2010 |
| WO | 2014133722 A1 | 9/2014 |

* cited by examiner

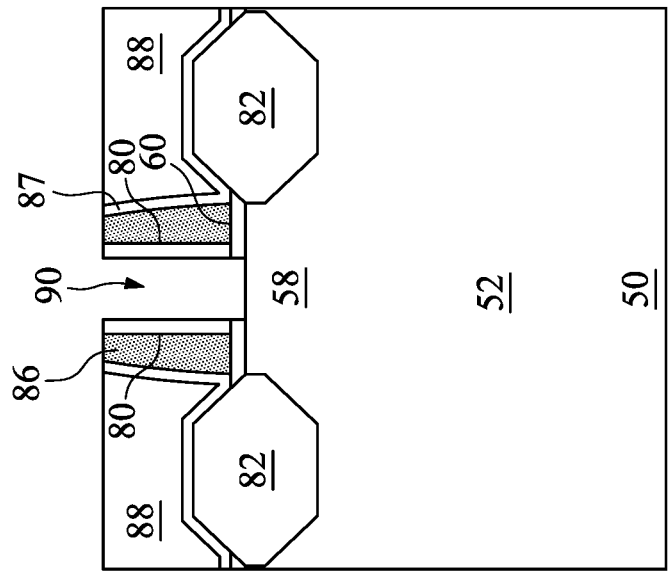
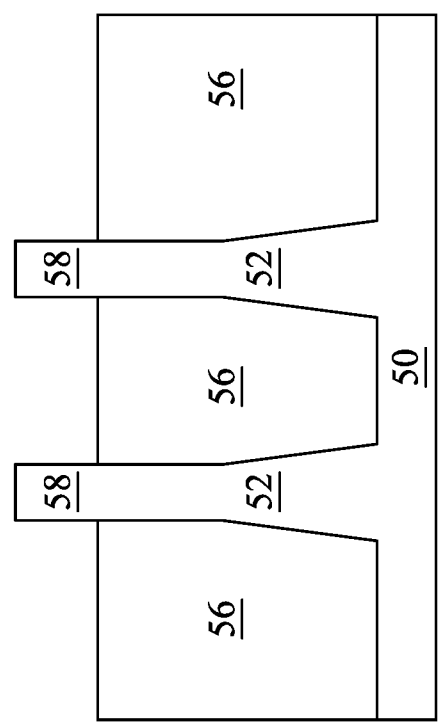
Fig. 13B
Fig. 13A

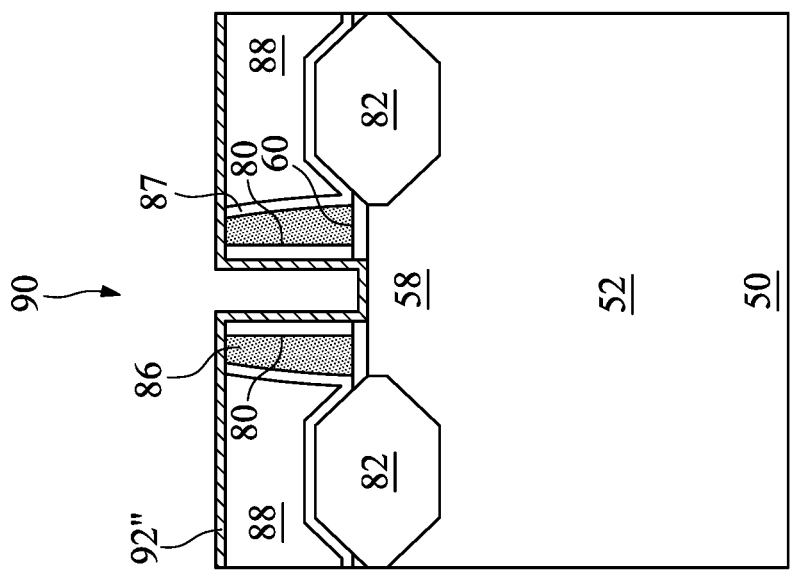
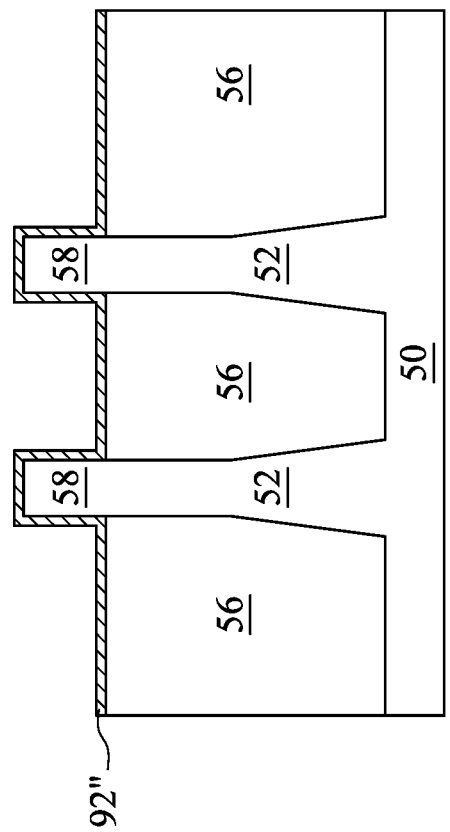
Fig. 20B
Fig. 20A

GATE STRUCTURE OF SEMICONDUCTOR DEVICE AND METHOD OF FORMING SAME

PRIORITY CLAIM AND CROSS-REFERENCE

This application claims the benefit of U.S. Provisional Application No. 63/266,110, filed on Dec. 29, 2021, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7, 8A, 8B, 9A, 9B, 10A, 10B, 10C, 10D, 11A, 11B, 12A, 12B, 13A, 13B, 15A, 15B, 16A, 16B, 18A, 18B, 19A, 19B, 20A, 20B, 21A, 21B, 21C, 21D, 22A, 22B, 23A, and 23B are cross-sectional views of intermediate stages in the manufacturing of a FinFET device in accordance with some embodiments.

DETAILED DESCRIPTION

Figure 1:
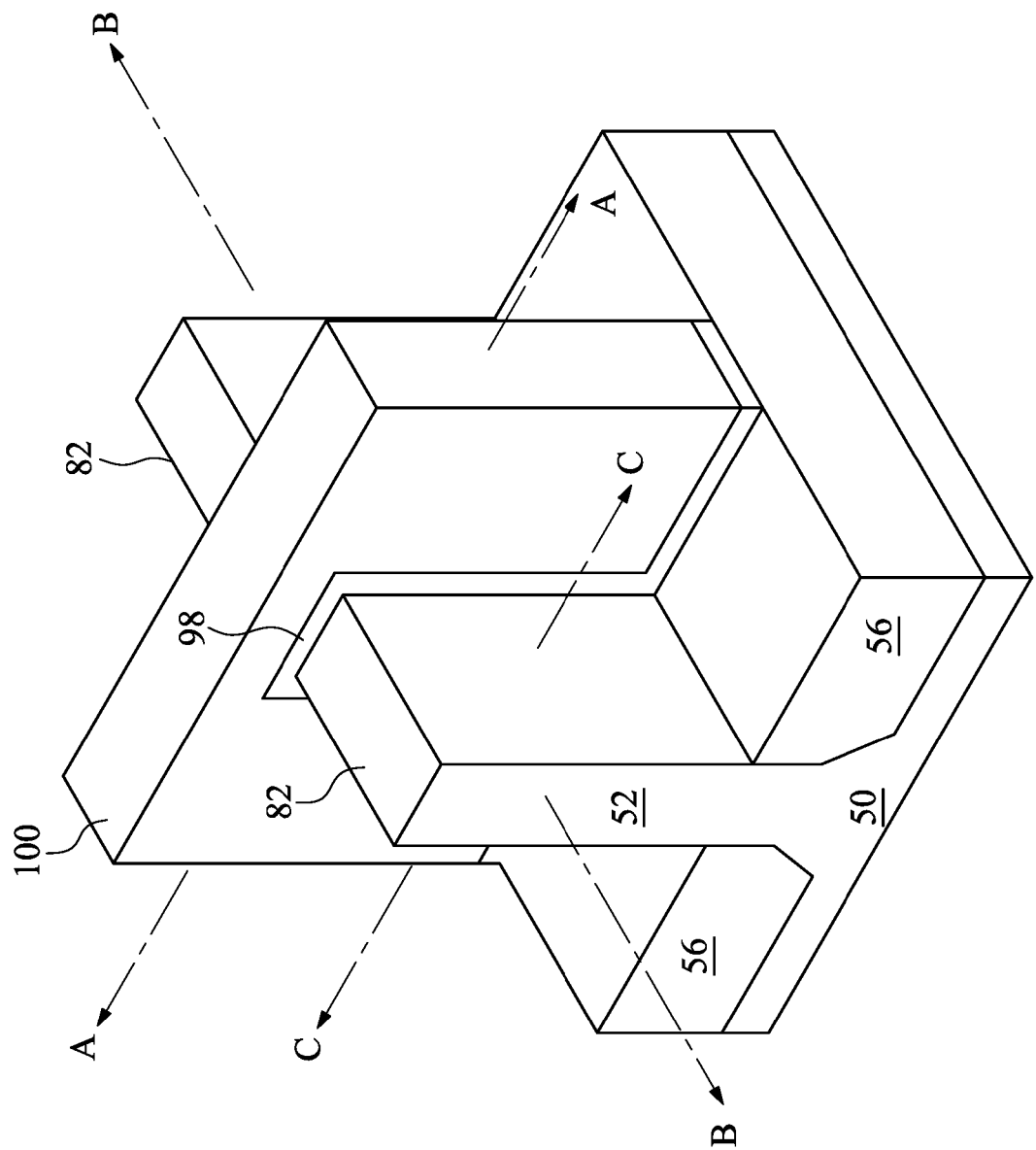
FIG. 1 illustrates an example of a FinFET in a three-dimensional view in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely, a gate structure of a semiconductor device and a method of forming the same. Various embodiments presented herein are discussed in the context of a fin field-effect transistor (FinFET) device formed using a gate-last process. In other embodiments, a gate-first process may be used. Various embodiments may be applied, however, to dies comprising other types of transistors, such as planar FETs, gate-all-around (GAA) transistors (for example, nanostructure (e.g., nanosheet, nanowire, or the like) field-effect transistors (NSFETs)), or the like, in lieu of or in combination with the FinFETs. Various embodiments discussed herein allow for improving (or reducing) a threshold voltage ($V_t$) of a semiconductor device, reducing interface trap density, improving reliability, and reducing or eliminating gate leakage. In some embodiments, a threshold voltage ($V_t$) of a semiconductor device may be improved by forming a dipole layer (comprising metal atoms) over an interfacial layer, performing a fluorine incorporation process on the dipole layer, and performing an anneal process to drive metal and fluorine atoms from the dipole layer into the interfacial layer.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 98 is along sidewalls and over a top surface of the fin 52, and a gate electrode 100 is over the gate dielectric layer 98. Source/drain regions 82 are disposed in opposite sides of the fin 52 with respect to the gate dielectric layer 98 and the gate electrode 100. Source/drain region(s) may refer to a source or a drain, individually or collectively dependent upon the context. FIG. 1 further illustrates reference cross-sections that are used in later figures. Cross-section A-A is along a longitudinal axis of the gate electrode

100 and in a direction, for example, perpendicular to a direction of a current flow between the source/drain regions 82 of the FinFET. Cross-section B-B is perpendicular to cross-section A-A and is along a longitudinal axis of the fin 52 and in a direction of, for example, the current flow between the source/drain regions 82 of the FinFET. Cross-section C-C is parallel to cross-section A-A and extends through the source/drain region 82 of the FinFET. Subsequent figures refer to these reference cross-sections for clarity.

FIGS. 2, 3, 4, 5, 6, 7, 8A, 8B, 9A, 9B, 10A, 10B, 10C, 10D, 11A, 11B, 12A, 12B, 13A, 13B, 15A, 15B, 16A, 16B, 18A, 18B, 19A, 19B, 20A, 20B, 21A, 21B, 21C, 21D, 22A, 22B, 23A, and 23B are cross-sectional views of intermediate stages in the manufacturing of a FinFET device in accordance with some embodiments. FIGS. 2-7, 8A-13A, 15A, 16A, and 18A-23A illustrate cross-sectional views along the reference cross-section A-A illustrated in FIG. 1, except for multiple fins/FinFETs. FIGS. 8B-13B, 15B, 16B, 18B-23B, 21C, and 21D illustrate cross-sectional views along the reference cross-section B-B illustrated in FIG. 1, except for multiple fins/FinFETs. FIGS. 10C and 10D illustrate cross-sectional views along the reference cross-section C-C illustrated in FIG. 1, except for multiple fins/FinFETs.

Figure 2:
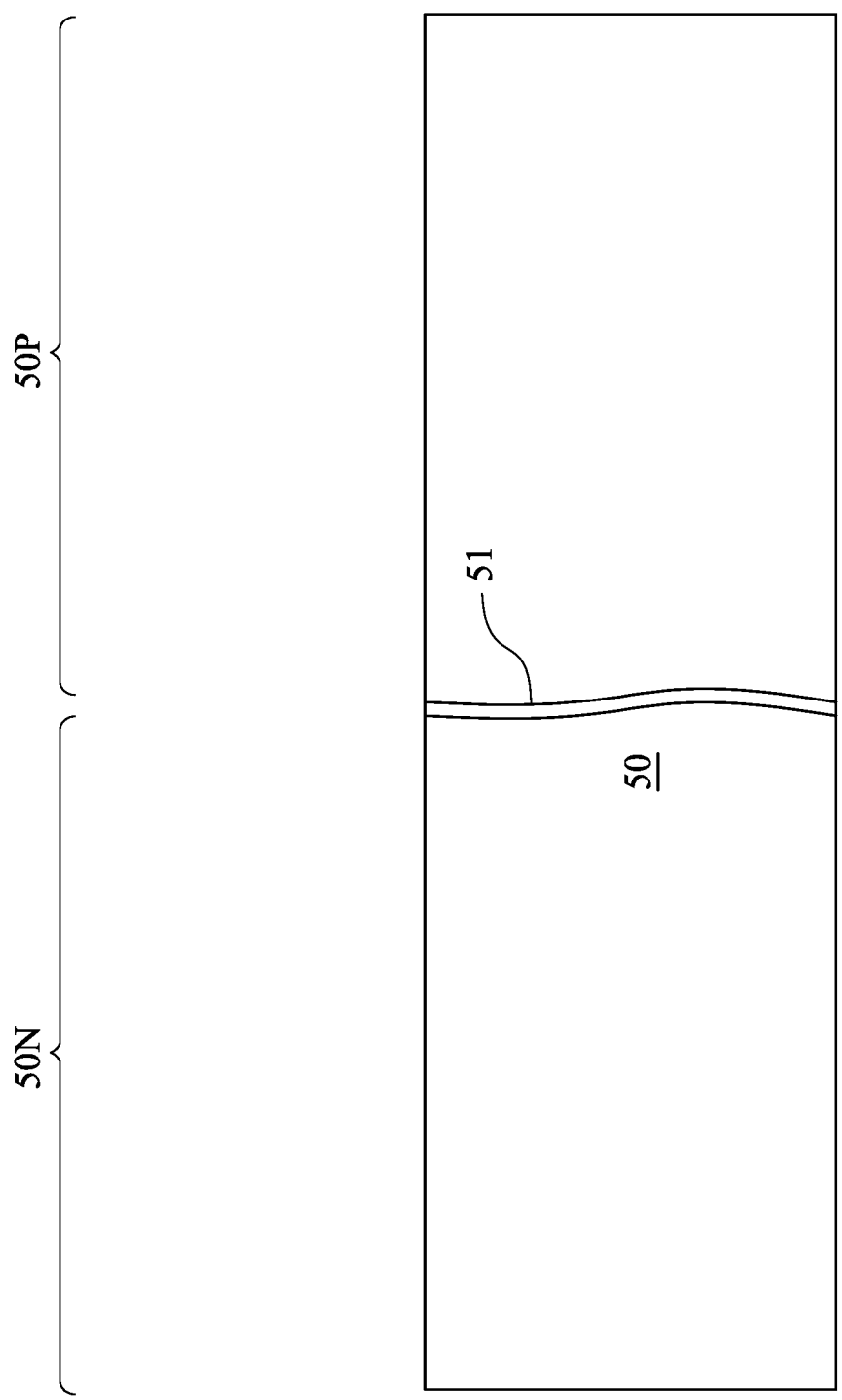

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P (as illustrated by a divider 51), and any number of device features (e.g., other active devices, doped regions, isolation structures, etc.) may be disposed between the region 50N and the region 50P.

Figure 3:
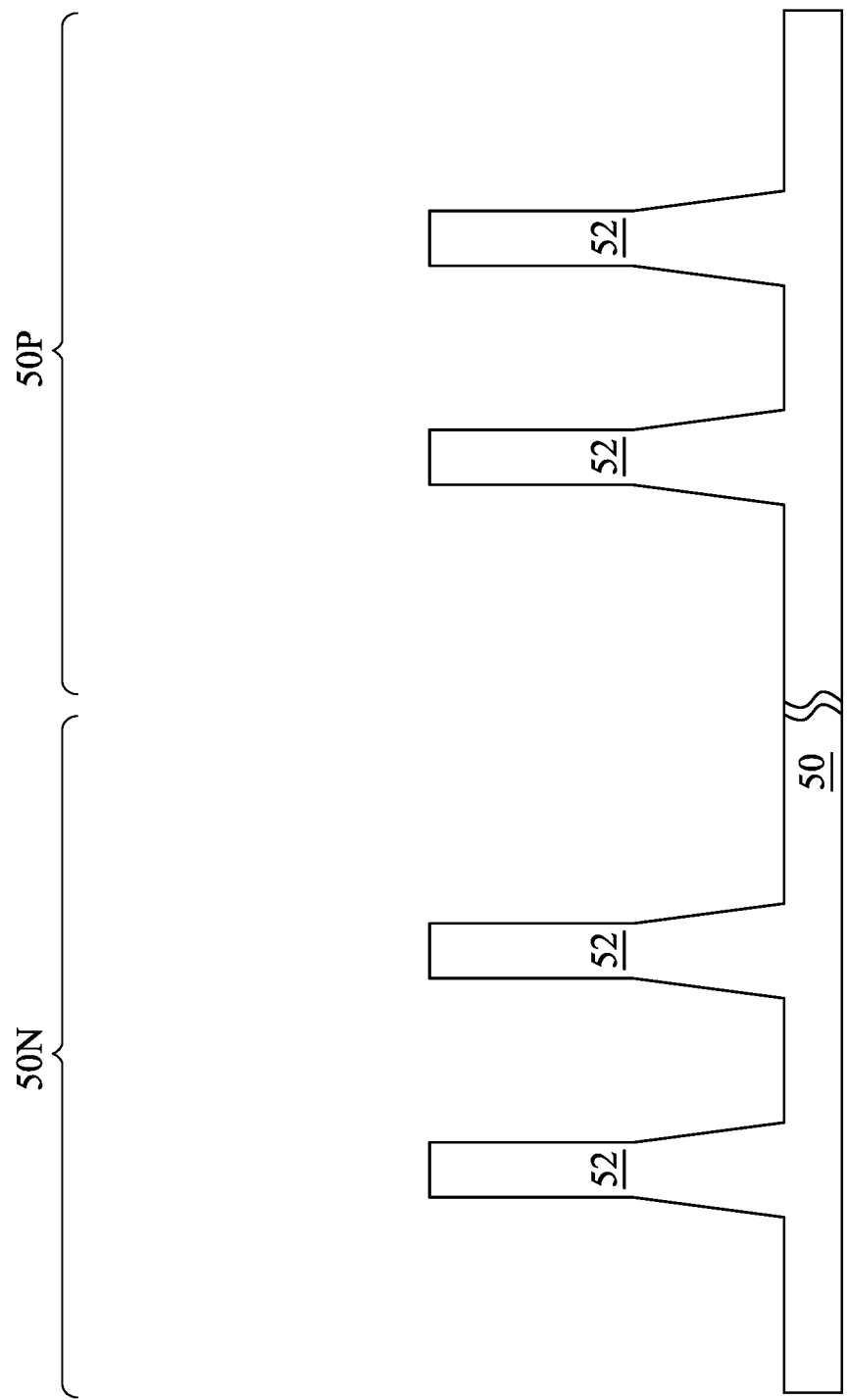

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), a combination thereof, or the like. The etch process may be anisotropic.

The fins 52 may be formed by any suitable method. For example, the fins 52 may be formed using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used as a mask to form the fins 52.

Figure 4:
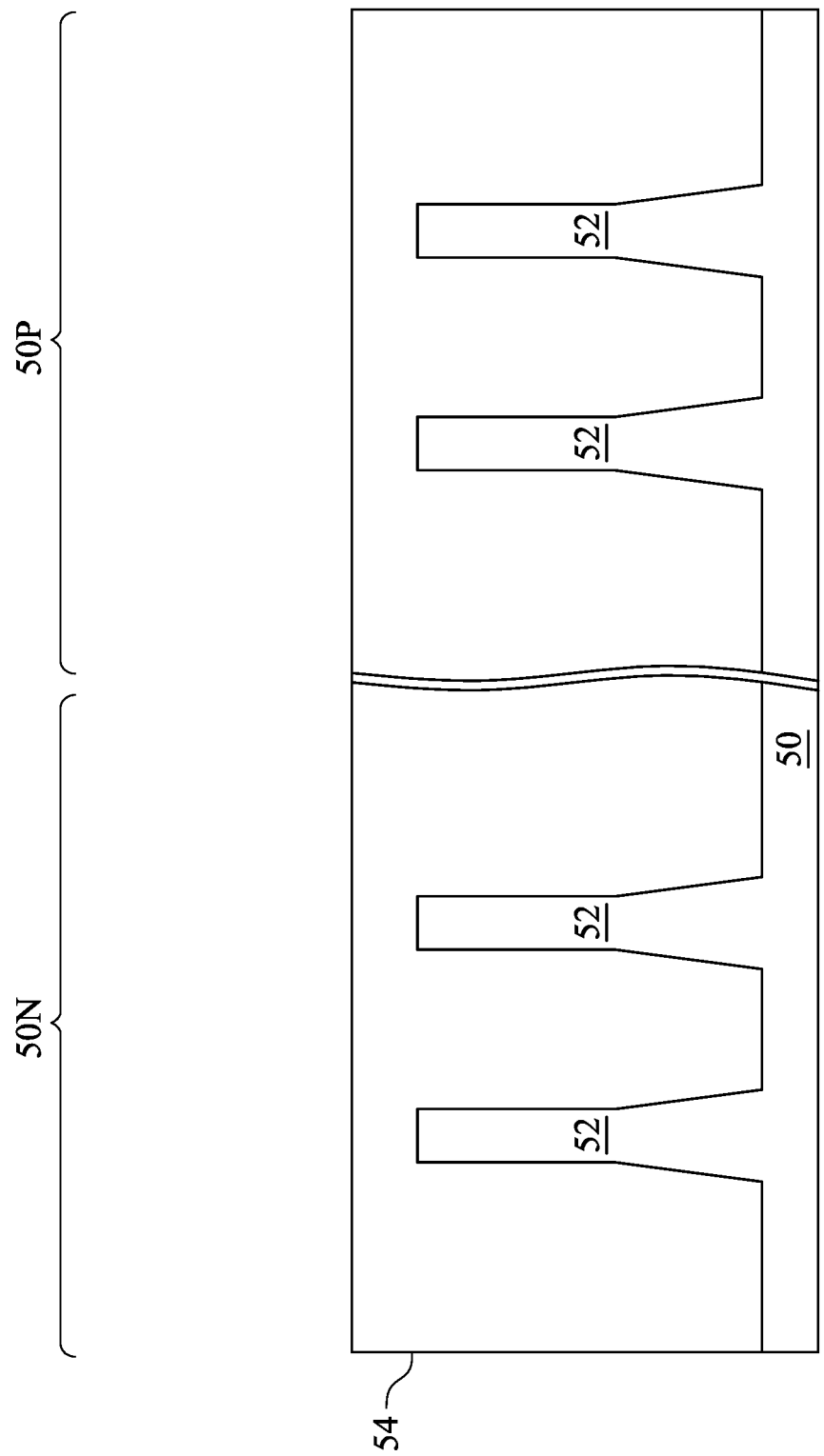

In FIG. 4, an insulation material 54 is formed over the substrate 50 and between neighboring fins 52. The insulation material 54 may be an oxide, such as silicon oxide, a nitride, a combination thereof, or the like, and may be formed by a high density plasma chemical vapor deposition (HDP-CVD), a flowable CVD (FCVD) (e.g., a CVD-based material deposition in a remote plasma system and post curing to make it convert to another material, such as an oxide), a combination thereof, or the like. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments, a liner (not shown) may first be formed along surfaces of the substrate 50 and the fins 52. Thereafter, a fill material, such as those discussed above may be formed over the liner.

Figure 5:
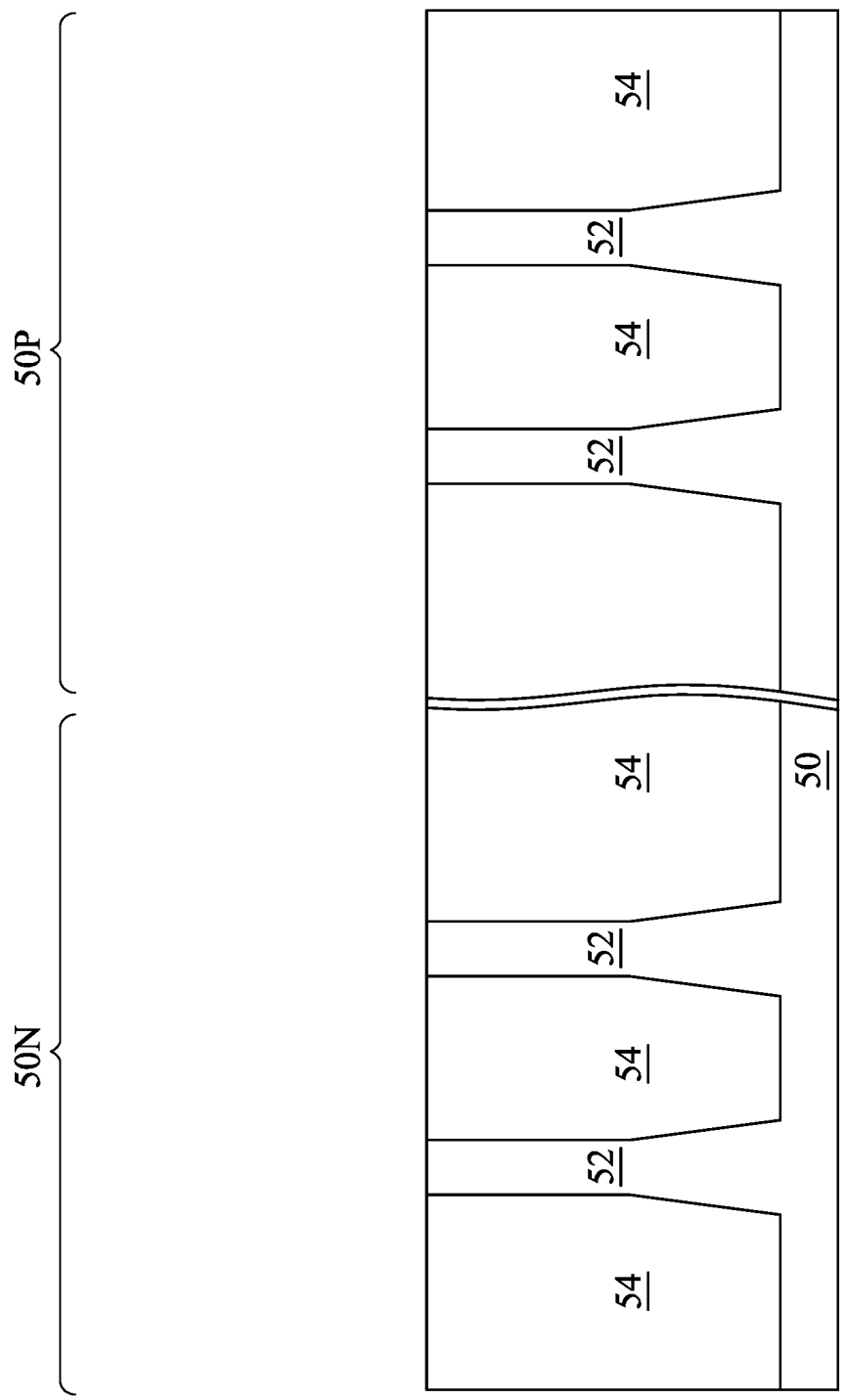

In FIG. 5, a removal process is applied to the insulation material 54 to remove excess portions of the insulation material 54 over the fins 52. In some embodiments, a planarization process, such as a chemical mechanical polish (CMP) process, an etch back process, a combination thereof, or the like, may be utilized. The planarization process exposes the fins 52 such that top surfaces of the fins 52 and the top surface of the insulation material 54 are level after the planarization process is completed within process variations of the planarization process.

Figure 6:
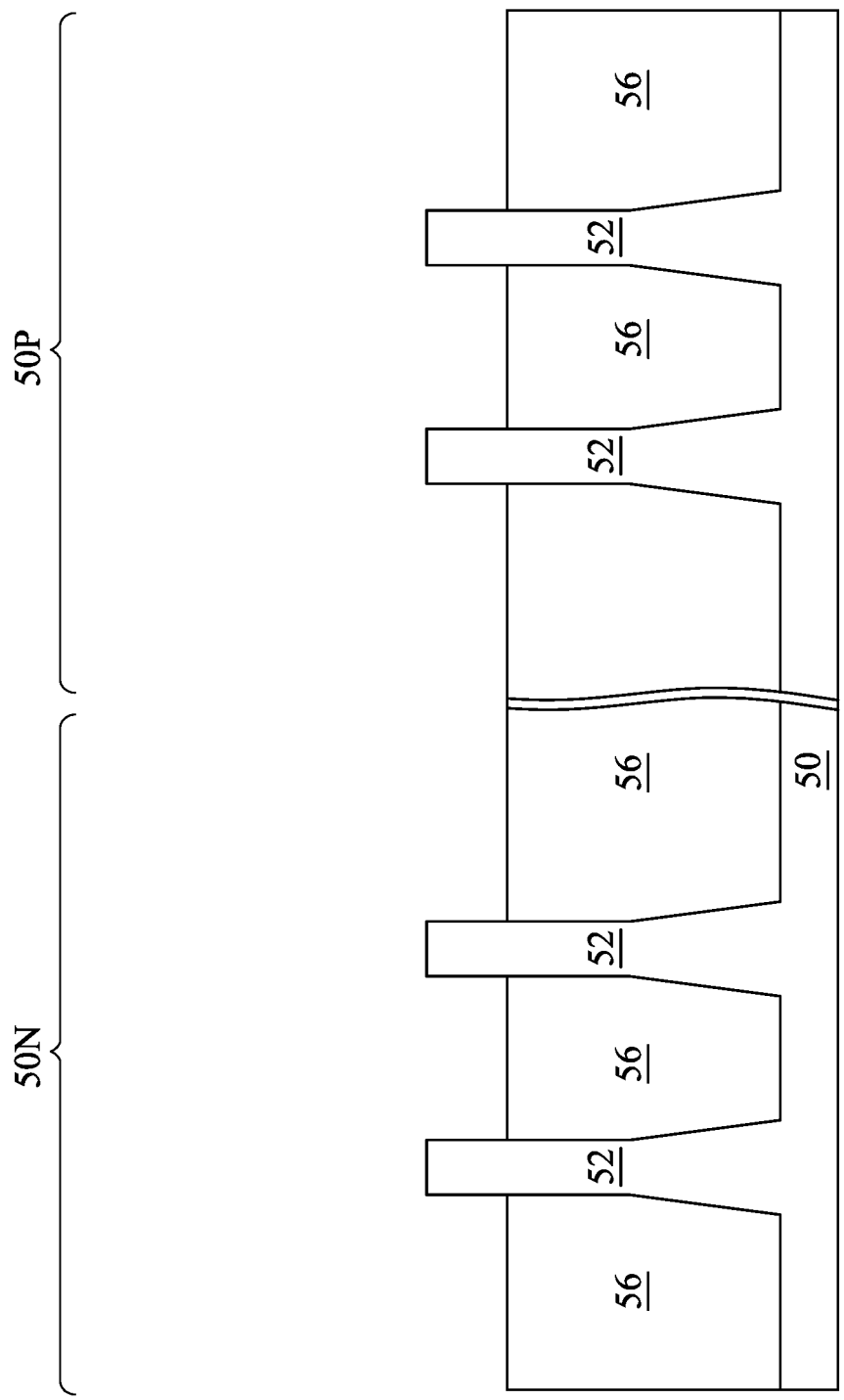

In FIG. 6, the insulation material 54 (see FIG. 5) is recessed to form isolation regions 56. The isolation regions 56 may be also referred to as shallow trench isolation (STI) regions. The insulation material 54 is recessed such that upper portions of fins 52 in the regions 50N and 50P protrude from between neighboring isolation regions 56. Further, the top surfaces of the isolation regions 56 may have a flat surface as illustrated, a convex surface, a concave surface (such as dishing), or a combination thereof. The top surfaces of the isolation regions 56 may be formed flat, convex, and/or concave by an appropriate etch. The isolation regions 56 may be recessed using an acceptable etching process, such as one that is selective to the material of the insulation material 54 (e.g., etches the material of the insulation material 54 at a faster rate than the material of the fins 52). For example, a chemical oxide removal with a suitable etch process using, for example, dilute hydrofluoric (dHF) acid may be used.

The process described with respect to FIGS. 2 through 6 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins. For example, the fins 52 in FIG. 5 can be recessed, and a material different from the fins 52 may be epitaxially grown over the recessed fins 52. In such embodiments, the fins comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins. In some embodiments where homoepitaxial or heteroepitaxial structures are epitaxially grown, the epitaxially grown materials may be in situ doped during growth, which may obviate prior and subsequent implantations, although in situ and implantation doping may be used together.

Still further, it may be advantageous to epitaxially grow a material in the region 50N different from a material in the region 50P. In various embodiments, upper portions of the fins 52 may be formed from silicon germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Further in FIG. 6, appropriate wells (not shown) may be formed in the fins 52 and/or the substrate 50. In some embodiments, a P well may be formed in the region 50N, and an N well may be formed in the region 50P. In some embodiments, a P well or an N well are formed in both the region 50N and the region 50P. In the embodiments with different well types, the different implant steps for the region 50N and the region 50P may be achieved using a photoresist or other masks (not shown). For example, a first photoresist may be formed over the fins 52 and the isolation regions 56 in both the region 50N and the region 50P. The first photoresist is patterned to expose the region 50P of the substrate 50. The first photoresist can be formed by using a spin-on technique and can be patterned using acceptable photolithography techniques. Once the first photoresist is patterned, an n-type impurity implantation is performed in the region 50P, while the remaining portion of the first photoresist acts as a mask to substantially prevent n-type impurities from being implanted into the region 50N. The n-type impurities may be phosphorus, arsenic, antimony, or the like, implanted in the region to a dose of equal to or less than $10^{15}$ $cm^{-2}$, such as between about $10^{12}$ $cm^{-2}$ and about $10^{15}$ $cm^{-2}$. In some embodiments, the n-type impurities may be implanted at an implantation energy of about 1 keV to about 10 keV. After the implantation, the first photoresist is removed, such as by an acceptable ashing process followed by a wet clean process.

Following the implantation of the region 50P, a second photoresist is formed over the fins 52 and the isolation regions 56 in both the region 50P and the region 50N. The second photoresist is patterned to expose the region 50N of the substrate 50. The second photoresist can be formed by using a spin-on technique and can be patterned using acceptable photolithography techniques. Once the second photoresist is patterned, a p-type impurity implantation may be performed in the region 50N, while the remaining portion of the second photoresist acts as a mask to substantially prevent p-type impurities from being implanted into the region 50P. The p-type impurities may be boron, $BF_2$, indium, or the like, implanted in the region to a dose of equal to or less than $10^{15}$ $cm^{-2}$, such as between about $10^{12}$ $cm^{-2}$ and about $10^{15}$ $cm^{-2}$. In some embodiments, the p-type impurities may be implanted at an implantation energy of about 1 keV to about 10 keV. After the implantation, the second photoresist may be removed, such as by an acceptable ashing process followed by a wet clean process.

After performing the implantations of the region 50N and the region 50P, an anneal process may be performed to activate the p-type and/or n-type impurities that were implanted. In some embodiments, the grown materials of epitaxial fins may be in situ doped during growth, which may obviate the implantations, although in situ doping and implantation doping may be used together.

Figure 7:
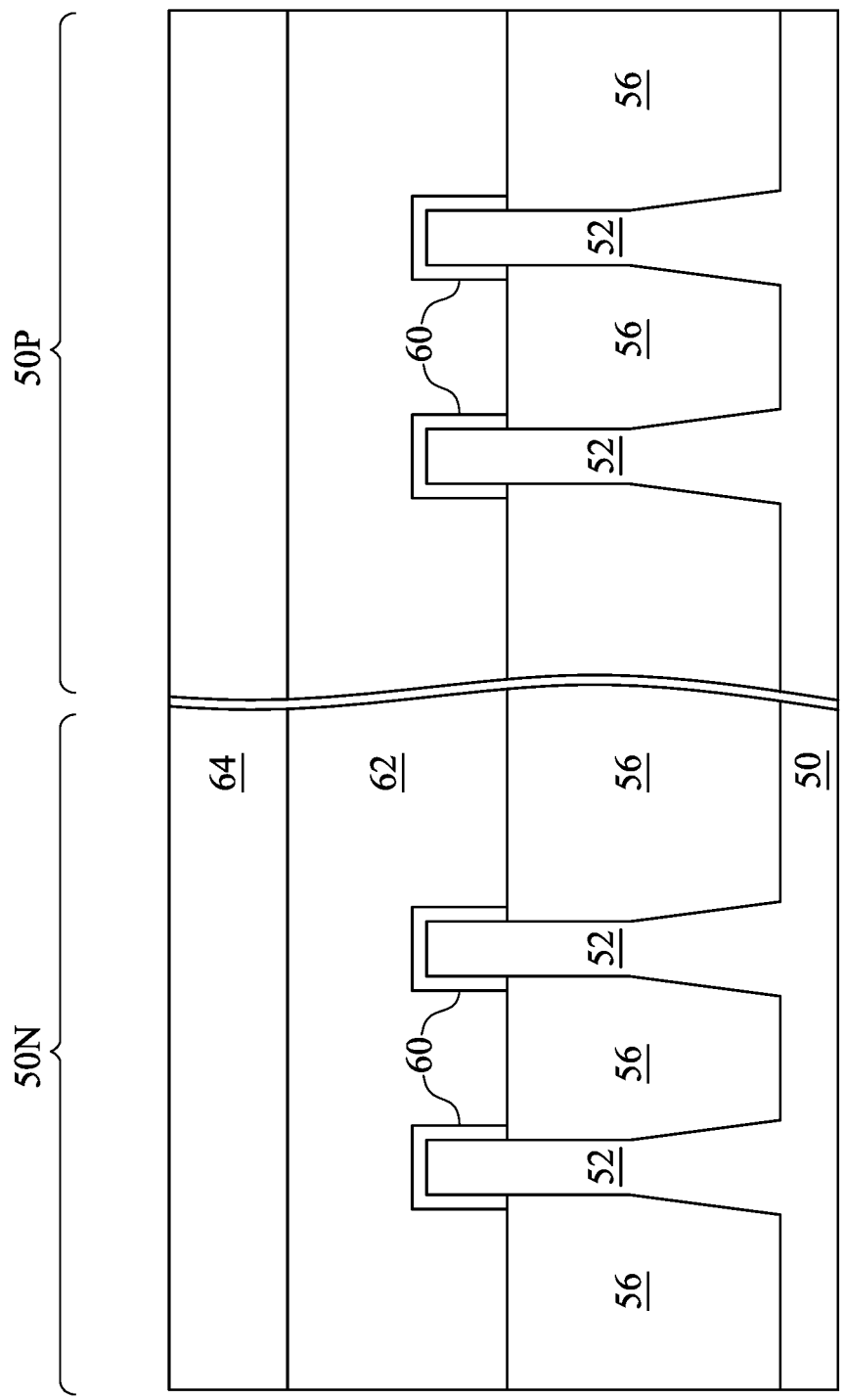

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized using, for example, a CMP process. After performing the planarization process, the mask layer 64 may be deposited over the dummy gate layer 62. The dummy gate layer 62 may be a conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques known and used in the art for depositing conductive materials. The dummy gate layer 62 may be made of other materials that have a high etching selectivity than materials of the isolation regions 56. The mask layer 64 may include, for example, one or more layers of silicon oxide, SiN, SiON, a combination thereof, or the like. In some embodiments, the mask layer 64 may comprise a layer of silicon nitride and a layer of silicon oxide over the layer of silicon nitride. In some embodiments, a single dummy gate layer 62 and a single mask layer 64 are formed across the region 50N and the region 50P. It is noted that the dummy dielectric layer 60 is shown covering only the fins 52 for illustrative purposes only. In some embodiments, the dummy dielectric layer 60 may be deposited such that the dummy dielectric layer 60 covers the isolation regions 56, extending between the dummy gate layer 62 and the isolation regions 56.

FIGS. 8A, 8B, 9A, 9B, 10A, 10B, 10C, 10D, 11A, 11B, 12A, 12B, 13A, 13B, 15A, 15B, 16A, 16B, 18A, 18B, 19A, 19B, 20A, 20B, 21A, 21B, 21C, 21D, 22A, 22B, 23A, and 23B illustrate various additional steps in the manufacturing of a FinFET device in accordance with some embodiments. FIGS. 8A, 8B, 9A, 9B, 10A, 10B, 10C, 10D, 11A, 11B, 12A, 12B, 13A, 13B, 15A, 15B, 16A, 16B, 18A, 18B, 19A, 19B, 20A, 20B, 21A, 21B, 21C, 21D, 22A, 22B, 23A, and 23B illustrate features in either of the region 50N and the region 50P. For example, the structures illustrated in FIGS. 8A, 8B, 9A, 9B, 10A, 10B, 10C, 10D, 11A, 11B, 12A, 12B, 13A, 13B, 15A, 15B, 16A, 16B, 18A, 18B, 19A, 19B, 20A, 20B, 21A, 21B, 21C, 21D, 22A, 22B, 23A, and 23B may be applicable to both the region 50N and the region 50P. Differences (if any) in the structures of the region 50N and the region 50P are described in the text accompanying each figure.

Figure 8B:
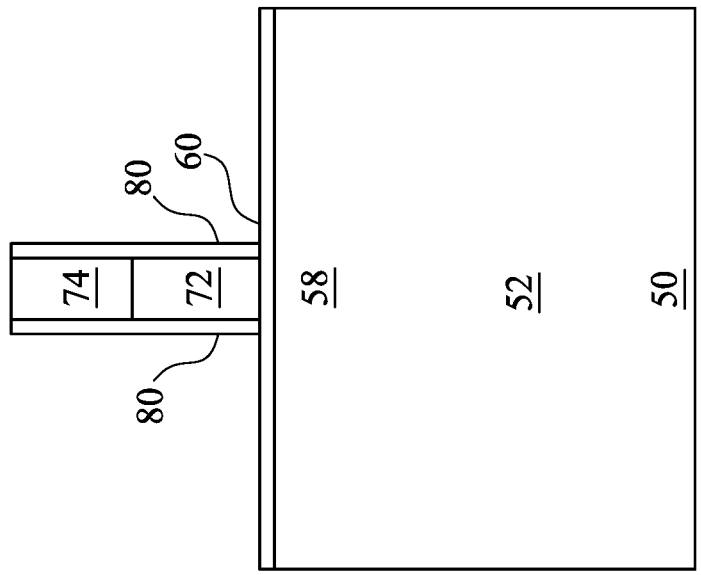
Figure 8A:
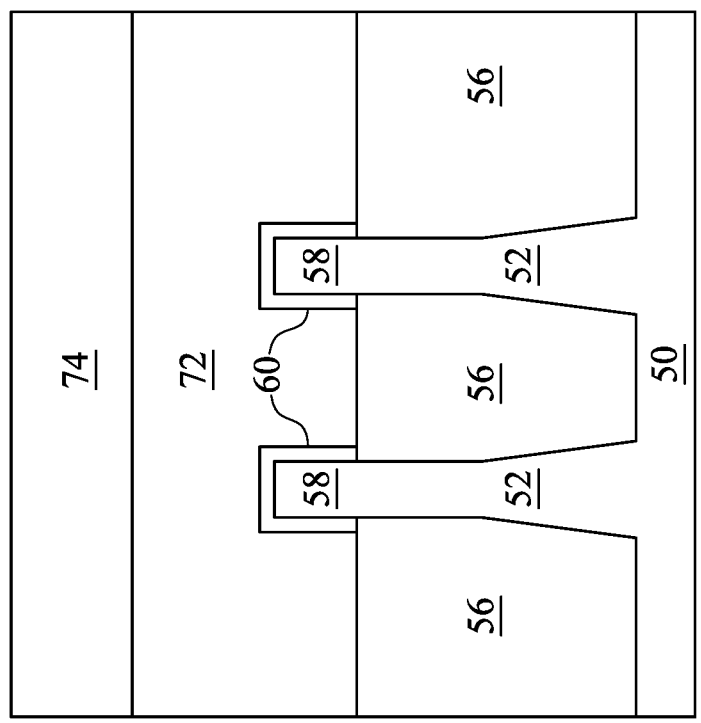

In FIGS. 8A and 8B, the mask layer 64 (see FIG. 7) may be patterned using acceptable photolithography and etching techniques to form masks 74. In some embodiments, the etching techniques may include one or more anisotropic etch processes such as a reactive ion etch (RIE), neutral beam etch (NBE), a combination thereof, or the like. Subsequently, the pattern of the masks 74 may be transferred to the dummy gate layer 62 (see FIG. 7) to form dummy gates 72. In some embodiments, the pattern of the masks 74 may also be transferred to the dummy dielectric layer 60 by an acceptable etching technique. The dummy gates 72 cover channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective one of the fins 52. As described below in greater detail, the dummy gates 72 are sacrificial gates and are subsequently replaced by replacement gates. Accordingly, dummy gates 72 may also be referred to as sacrificial gates. In other embodiments, some of the dummy gates 72 are not replaced and remain in the final structure of the resulting FinFET device.

Further in FIGS. 8A and 8B, gate seal spacers 80 may be formed on exposed surfaces of the dummy gates 72, the masks 74, and/or the fins 52. A thermal oxidation or a deposition followed by an anisotropic etch may form the gate seal spacers 80. The gate seal spacers 80 may comprise silicon oxide, silicon nitride, SiCN, SiOC, SiOCN, a combination thereof, or the like. After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the region 50N, while exposing the region 50P, and appropriate type (e.g., p-type) impurities may be implanted into the exposed fins 52 in the region 50P. The mask may then be removed. Subsequently, a mask, such as a photoresist, may be formed over the region 50P, while exposing the region 50N, and appropriate type impurities (e.g., n-type) may be implanted into the exposed fins 52 in the region 50N. The mask may then be removed. The n-type impurities may be the any of the n-type impurities previously discussed, and the p-type impurities may be the any of the p-type impurities previously discussed. The lightly doped source/drain regions may have a dose of impurities of from about $10^{12}$ cm$^{-2}$ to about $10^{16}$ cm$^{-2}$. In some embodiments, the suitable impurities may be implanted at an implantation energy of about 1 keV to about 10 keV. An anneal may be used to activate the implanted impurities.

Figure 9B:
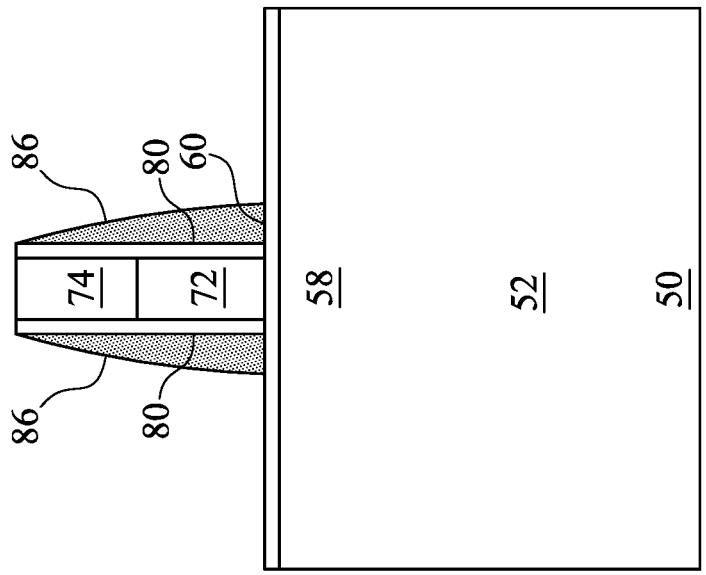
Figure 9A:
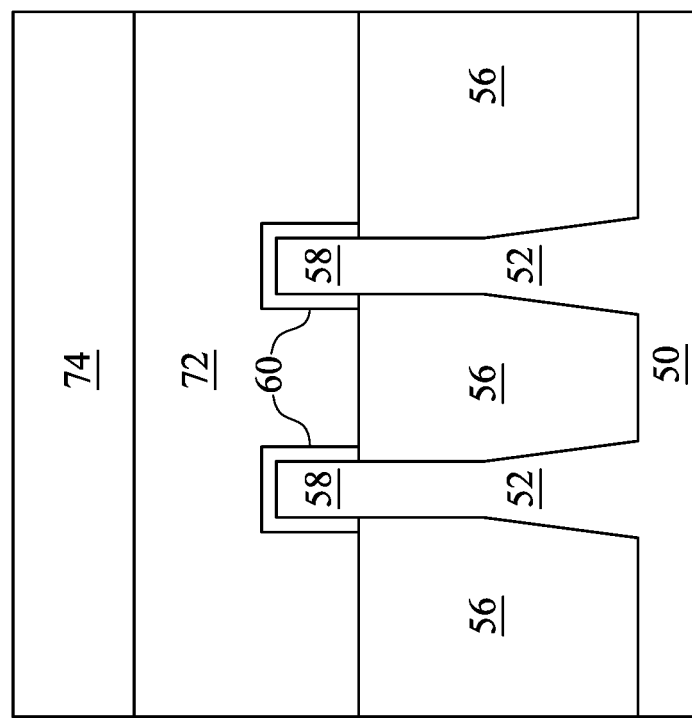

In FIGS. 9A and 9B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may comprise silicon oxide, silicon nitride, SiCN, SiOC, SiOCN, a combination thereof, or the like. In some embodiments, the gate spacers 86 may comprise a plurality of layers (not shown), such that the layers comprise different materials. In some embodiments, the gate spacers 86 and the gate seal spacers 80 comprise a same material. In other embodiments, the gate spacers 86 and the gate seal spacers 80 comprise different materials.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 86, yielding "L-shaped" gate seal spacers, spacers may be formed and removed, and/or the like). Furthermore, the n-type and p-type devices may be formed using a different structures and steps. For example, LDD regions for n-type devices may be formed prior to forming the gate seal spacers 80, while the LDD regions for p-type devices may be formed after forming the gate seal spacers 80.

Figure 10B:
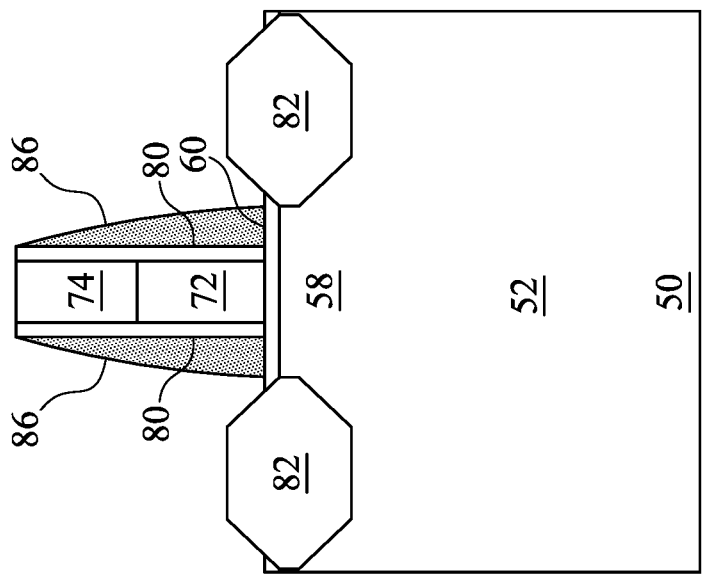
Figure 10A:
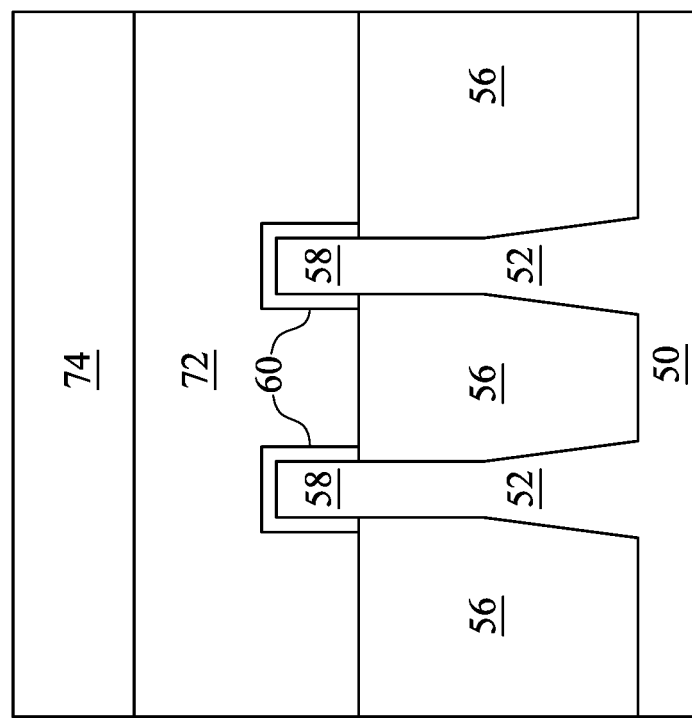
Figure 10D:
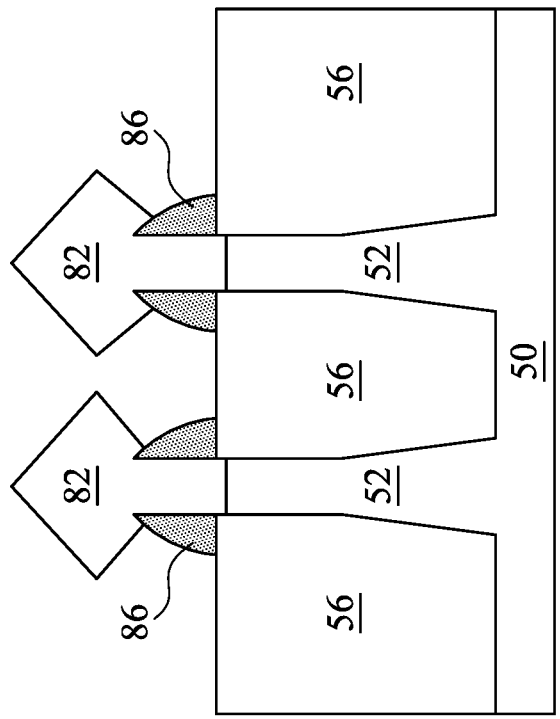
Figure 10C:
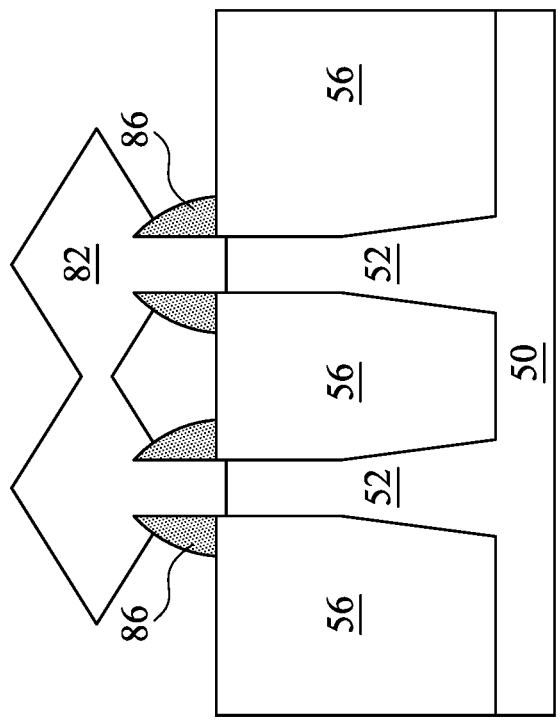

In FIGS. 10A and 10B, epitaxial source/drain regions 82 are formed in the fins 52 to exert stress in the respective channel regions 58, thereby improving device performance. The epitaxial source/drain regions 82 are formed in the fins 52 such that each dummy gate 72 is disposed between respective neighboring pairs of the epitaxial source/drain regions 82. In some embodiments, the epitaxial source/drain regions 82 may extend into, and may also penetrate through, the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFET device.

The epitaxial source/drain regions 82 in the region 50N may be formed by masking the region 50P and etching source/drain regions of the fins 52 in the region 50N to form recesses in the fins 52. Then, the epitaxial source/drain regions 82 in the region 50N are epitaxially grown in the recesses. The epitaxial source/drain regions 82 may include any acceptable material, such as appropriate for n-type FinFETs. For example, if the fin 52 comprises silicon, the epitaxial source/drain regions 82 in the region 50N may include materials exerting a tensile strain in the channel region 58, such as silicon, SiC, SiCP, SiP, a combination thereof, or the like. The epitaxial source/drain regions 82 in the region 50N may have surfaces raised from respective surfaces of the fins 52 and may have facets.

The epitaxial source/drain regions 82 in the region 50P may be formed by masking the region 50N and etching source/drain regions of the fins 52 in the region 50P to form recesses in the fins 52. Then, the epitaxial source/drain regions 82 in the region 50P are epitaxially grown in the recesses. The epitaxial source/drain regions 82 may include any acceptable material, such as appropriate for p-type FinFETs. For example, if the fin 52 comprises silicon, the epitaxial source/drain regions 82 in the region 50P may comprise materials exerting a compressive strain in the channel region 58, such as SiGe, SiGeB, Ge, GeSn, a combination thereof, or the like. The epitaxial source/drain regions 82 in the region 50P may also have surfaces raised from respective surfaces of the fins 52 and may have facets.

The epitaxial source/drain regions 82 and/or the fins 52 may be implanted with dopants, similar to the process previously discussed for forming lightly-doped source/drain regions, followed by an anneal. The epitaxial source/drain regions 82 may have an impurity concentration of between about $10^{19}$ cm$^{-3}$ and about $10^{21}$ cm$^{-3}$. The n-type and/or p-type impurities for the epitaxial source/drain regions 82 may be any of the impurities previously discussed. In some embodiments, the epitaxial source/drain regions 82 may be in situ doped during growth.

As a result of the epitaxy processes used to form the epitaxial source/drain regions 82 in the region 50N and the region 50P, upper surfaces of the epitaxial source/drain regions have facets which expand laterally outward beyond sidewalls of the fins 52. In some embodiments, these facets cause adjacent epitaxial source/drain regions 82 of a same FinFET to merge as illustrated by FIG. 10C. In other embodiments, adjacent epitaxial source/drain regions 82 remain separated after the epitaxy process is completed as illustrated by FIG. 10D. In the embodiments illustrated in FIGS. 10C and 10D, the gate spacers 86 are formed covering a portion of the sidewalls of the fins 52 that extend above the isolation regions 56 thereby blocking the epitaxial growth. In other embodiments, the spacer etch used to form the gate spacers 86 may be adjusted to remove the spacer material from the sidewalls of the fins 52 to allow the epitaxially grown region to extend to the surface of the isolation region 56.

Figure 11B:
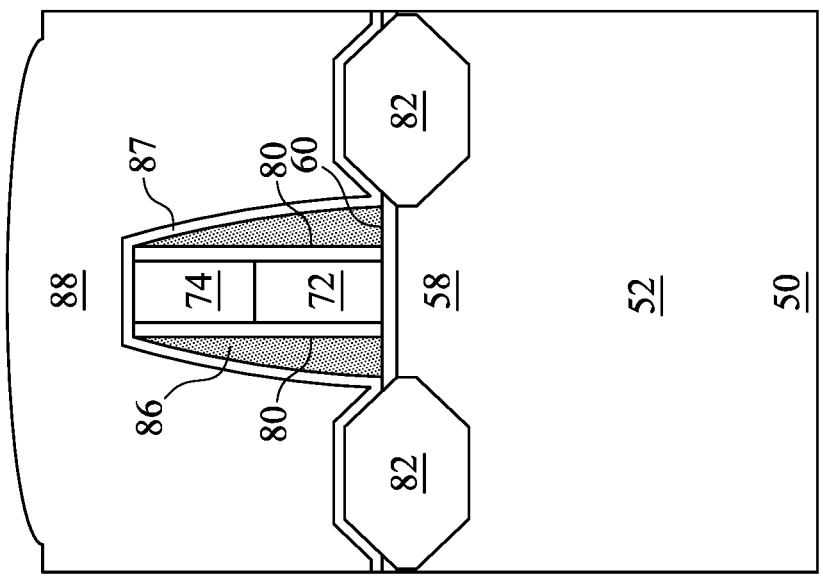
Figure 11A:
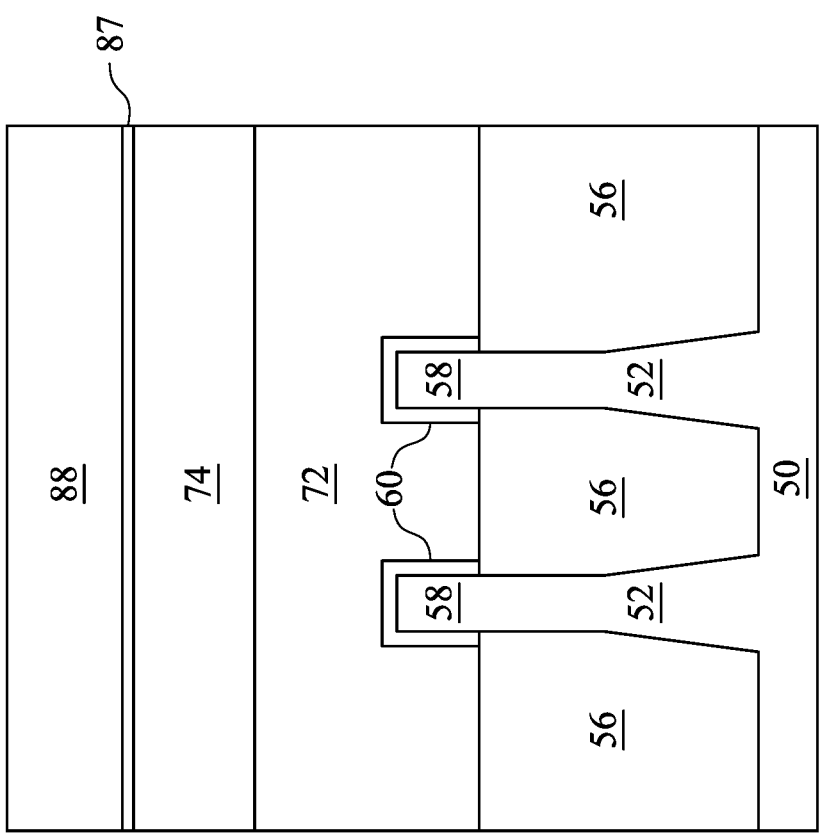

In FIGS. 11A and 11B, a first inter-layer dielectric (ILD) 88 is deposited over the structure illustrated in FIGS. 10A and 10B. The first ILD 88 may be formed of a dielectric material, and may be deposited by any suitable method, such as CVD, plasma-enhanced CVD (PECVD), FCVD, a combination thereof, or the like. Dielectric materials may include Phospho-Silicate Glass (PSG), Boro-Silicate Glass (BSG), Boron-Doped Phospho-Silicate Glass (BPSG), undoped Silicate Glass (USG), or the like. Other insulation materials formed by any acceptable process may be also used. In some embodiments, a contact etch stop layer (CESL) 87 is disposed between the first ILD 88 and the epitaxial source/drain regions 82, the masks 74, and the gate spacers 86. The CESL 87 may comprise a dielectric material, such as, silicon nitride, silicon oxide, silicon oxynitride, a combination thereof, or the like, having a different etch rate than the material of the overlying first ILD 88.

Figure 12B:
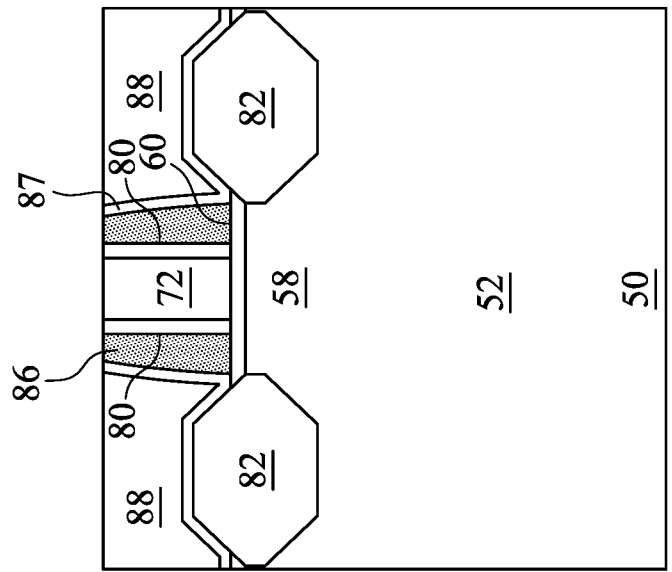
Figure 12A:
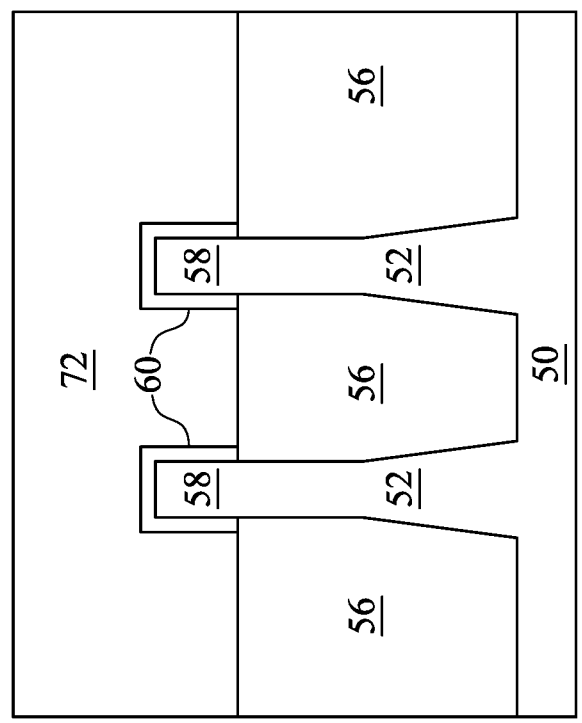

In FIGS. 12A and 12B, a planarization process, such as a CMP process, may be performed to level the top surface of the first ILD 88 with the top surfaces of the dummy gates 72 or the masks 74 (see FIGS. 11A and 11B). The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level with each other within process variations of the planarization process. Accordingly, the top surfaces of the dummy gates 72 are exposed through the first ILD 88. In some embodiments, the masks 74 may remain, in which case the planarization process levels the top surface of the first ILD 88 with the top surfaces of the masks 74.

In FIGS. 13A and 13B, the dummy gates 72, and the masks 74 (see FIGS. 11A and 11B), if present, are removed in an etching step(s), so that openings 90 are formed. Portions of the dummy dielectric layer 60 in the openings 90 may also be removed. In some embodiments, only the dummy gates 72 are removed and the dummy dielectric layer 60 remains and is exposed by the openings 90. In some embodiments, the dummy dielectric layer 60 is removed from the openings 90 in a first region of a die (e.g., a core logic region) and remains in openings 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 without etching the first ILD 88 or the gate spacers 86. Each opening 90 exposes a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

Figure 14:
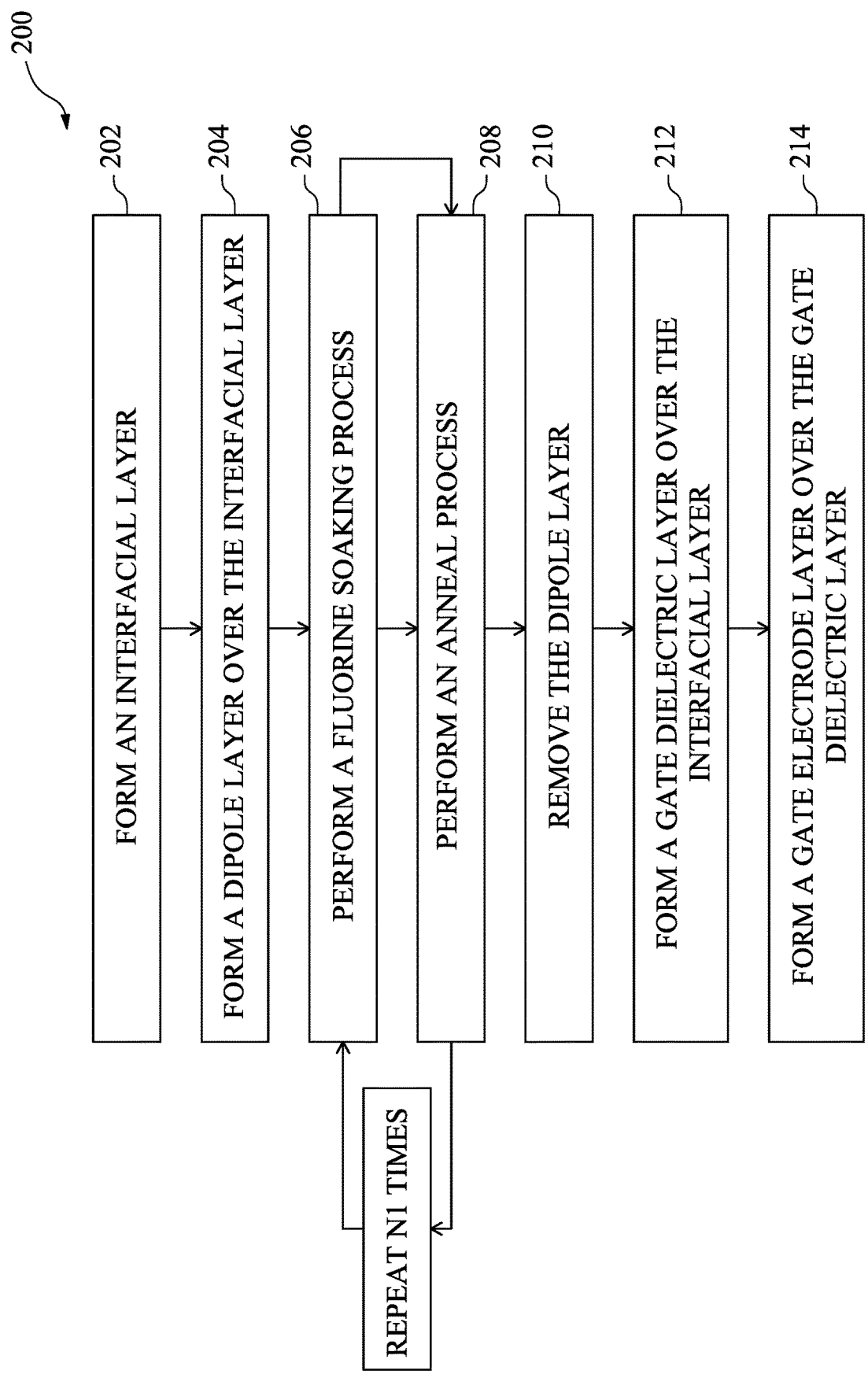
FIG. 14 is a flow diagram illustrating a method of forming gate stacks in accordance with some embodiments.

FIG. 14 is a flow diagram illustrating a method 200 of forming gate stacks 102 (see FIGS. 21A-21D) in accordance with some embodiments. FIGS. 15A, 15B, 16A, 16B, 18A, 18B, 19A, 19B, 20A, 20B, 21A, 21B, 21C, and 21D are cross-sectional views of intermediate stages in the manufacturing of the gate stacks 102 in accordance with the method 200. The gate stacks 102 may be also referred to as replacement gate stacks, or metal gate stacks.

Figure 15B:
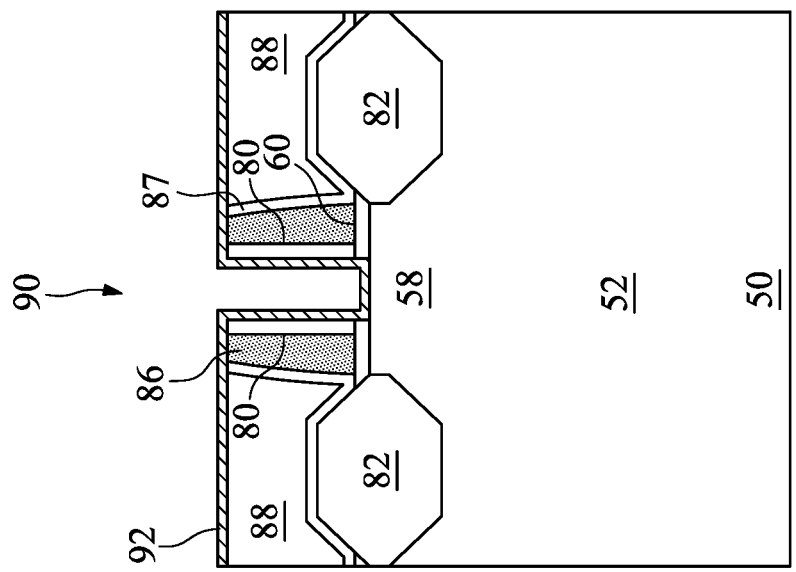
Figure 15A:
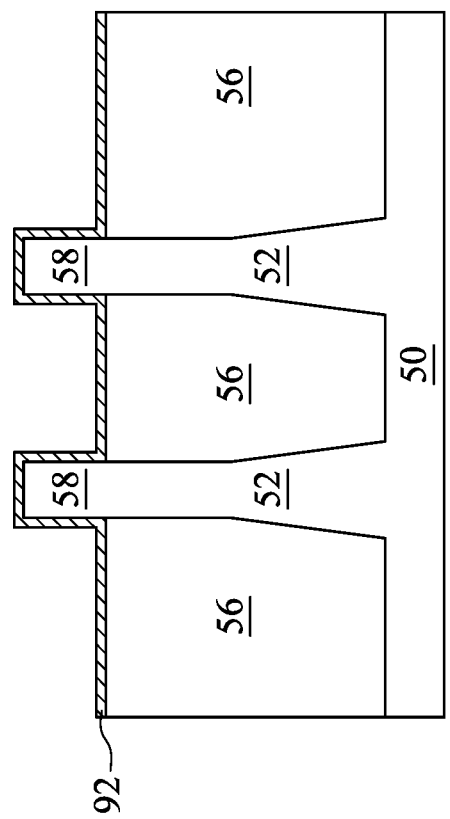

Referring to FIGS. 14, 15A, and 15B, in step 202, an interfacial layer 92 is formed along sidewalls and bottoms of the openings 90 and over the first ILD 88. The interfacial layer 92 may comprise silicon oxide and may be formed using a chemical deposition process, such as ALD, CVD, or the like, or using an oxidation process. In some embodiments when the interfacial layer 92 is formed using a deposition process, the interfacial layer 92 extends along exposed surfaces of the fins 52, the isolation regions 56, and the gate seal spacers 80. In some embodiments when the interfacial layer 92 is formed using an oxidation process, the interfacial layer 92 extends along exposed surfaces of the fins 52, and does not extend along exposed surfaces of the isolation regions 56 and the gate seal spacers 80. In some embodiments, the interfacial layer 92 has a thickness between about 8 Å and about 20 Å.

Figure 16B:
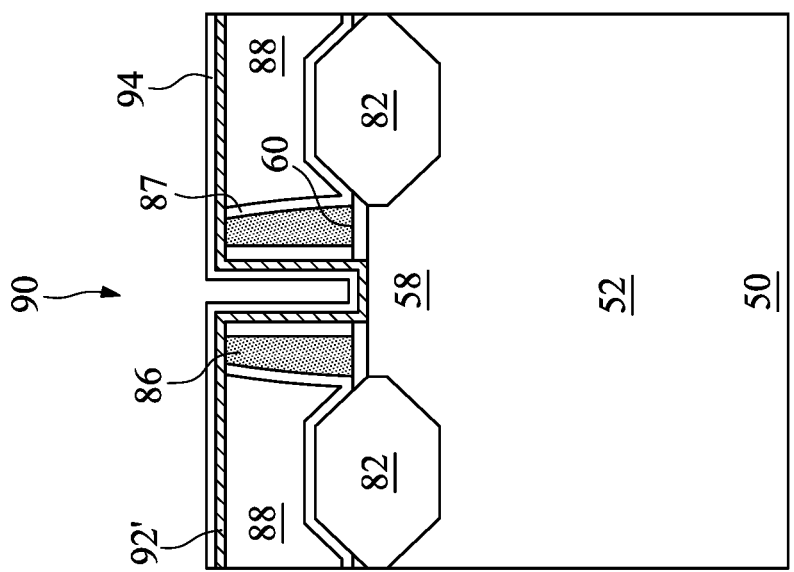
Figure 16A:
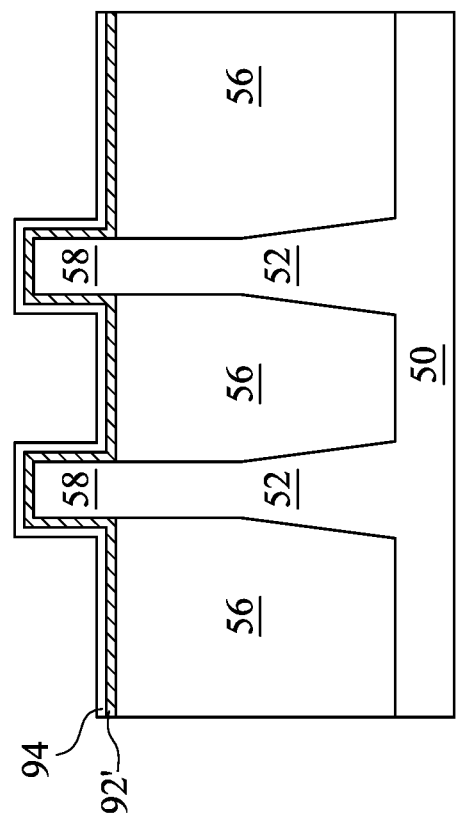

Referring to FIGS. 14, 16A, and 16B, in step 204, a dipole layer 94 is formed over the interfacial layer 92 in the openings 90. In some embodiments, in the region 50N (see FIG. 2), the dipole layer 94 comprises a metal oxide material, such as lanthanum oxide ($La_2O_3$), yttrium oxide ($Y_2O_3$), a combination thereof, or the like, and may be formed using ALD, CVD, a combination thereof, or like. In such embodiments, the dipole layer 94 may be also referred to as an n-dipole layer. In some embodiments, in the region 50P (see FIG. 2), the dipole layer 94 comprises a metal oxide material, such as zinc oxide (ZnO), aluminum oxide ($Al_2O_3$), gallium oxide ($Ga_2O$ or $Ga_2O_3$), a combination thereof, or the like, and may be formed using ALD, CVD, a combination thereof, or like. In such embodiments, the dipole layer 94 may be also referred to as a p-dipole layer. In some embodiments, during the deposition process, some of metal atoms of the dipole layer 94 diffuse into the interfacial layer 92 to form a metal-doped interfacial layer 92'. In some embodiments, diffused metal atoms form dipoles at an interface between the metal-doped interfacial layer 92' and subsequently formed gate dielectric layer, and alter a threshold voltage of a resulting FinFET device. In some embodiments, amount of metal atoms that are diffused into the interfacial layer 92 (see FIGS. 15A and 15B) may be increased by increasing a thickness of the dipole layer 94. In some embodiments, the dipole layer 94 has a thickness between about 1 Å and about 15 Å.

Figure 17:
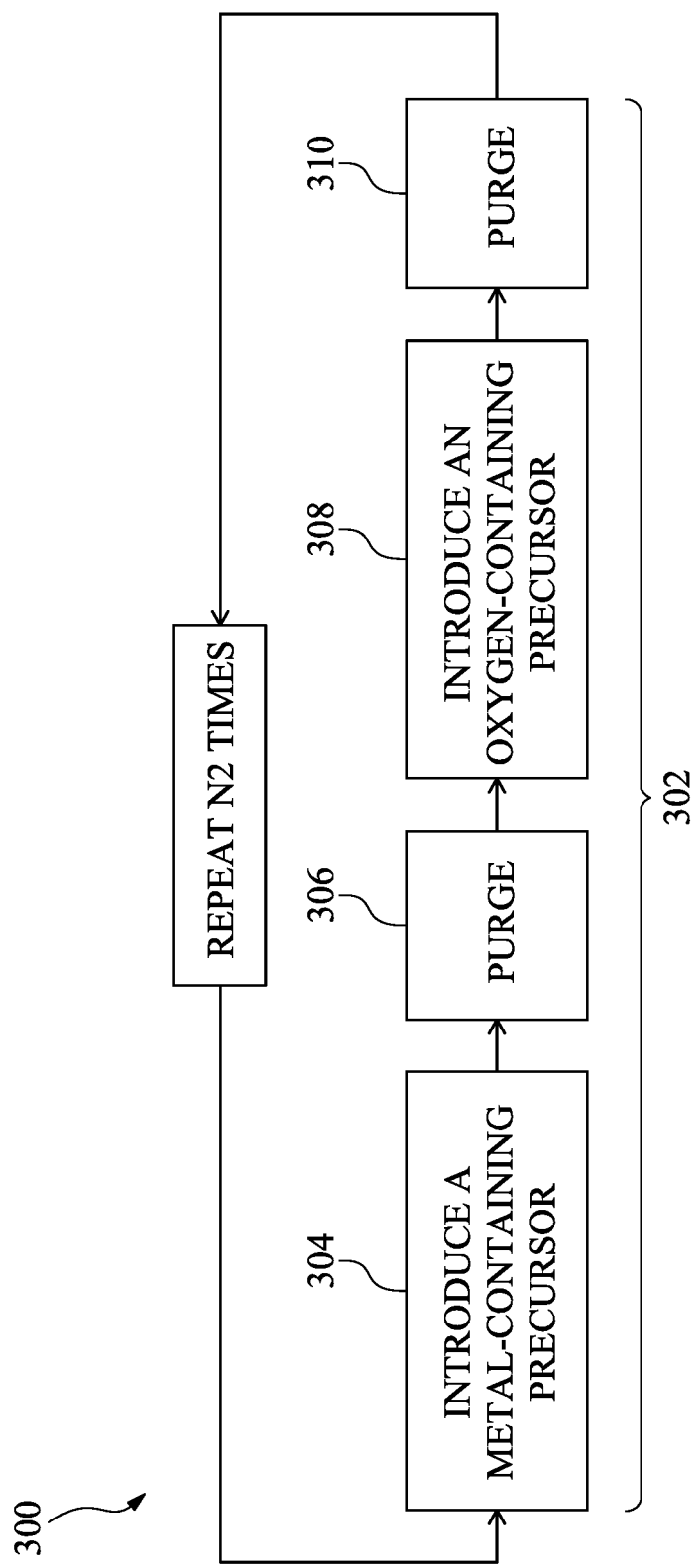
FIG. 17 is a flow diagram illustrating a method of forming a dipole layer in accordance with some embodiments.

FIG. 17 is a flow diagram illustrating a method 300 of forming the dipole layer 94 (see FIGS. 16A and 16B) in accordance with some embodiments. In some embodiments, the method 300 may be implemented as step 204 of the method 200 (see FIG. 14). In the illustrated embodiment, the method 300 comprises an ALD process. The method 300 comprises performing an ALD cycle 302 one or more times. In some embodiments, the ALD cycle 302 is performed N2 times. In some embodiments, N2 may be between 1 and 100. In some embodiments, the method 300 is performed at a temperature between about 150° C. and about 650° C. In some embodiments, the method 300 may be performed at a pressure between about 0.1 Torr and about 70 Torr.

In some embodiments, the ALD cycle 302 may comprise performing step 304, where a metal-containing precursor is introduced over the interfacial layer 92 (see FIGS. 15A and 15B). In some embodiments, the metal-containing precursor is adsorbed on an exposed surface of the interfacial layer 92. In some embodiments, the metal-containing precursor may be introduced for a time between about 0.1 sec and about 60 sec. In some embodiments, a flow rate of the metal-containing precursor may be between about 200 sccm and about 5000 sccm.

In step 306, un-adsorbed portions of the metal-containing precursor are purged using a non-reactive gas such as $N_2$, Ar, the like, or a combination thereof. In some embodiments, the purge is performed for a time between 0.1 sec and about 60 sec. In some embodiments, a flow rate of the non-reactive gas may be between about 200 sccm and about 5000 sccm.

In step 308, an oxygen-containing precursor is introduced over adsorbed portions of the metal-containing precursor. The oxygen-containing precursor reacts with adsorbed portions of the metal-containing precursor and forms a metal oxide material of the dipole layer 94. In some embodiments, the oxygen-containing precursor may comprise $H_2O$, $O_2$, $O_3$, the like, or a combination thereof. In some embodiments, the oxygen-containing precursor is introduced for a time between 0.1 sec and about 60 sec. In some embodiments, a flow rate of the oxygen-containing precursor may be between about 200 sccm and about 5000 sccm.

In step 310, reaction by-products of step 308 are purged using a non-reactive gas such as $N_2$, Ar, the like, or a combination thereof. In some embodiments, the purge is performed for a time between 0.1 sec and about 60 sec. In some embodiments, a flow rate of the non-reactive gas may be between about 200 sccm and about 5000 sccm.

In some embodiments when the dipole layer 94 comprises aluminum oxide ($Al_2O_3$), the metal-containing precursor comprises TMA ($Al_2(CH_3)_6$), the oxygen-containing precursor comprises $H_2O$, and the method 300 is performed at a temperature between about 250° C. and about 550° C. and a pressure between about 0.5 Torr and about 40 Torr.

In some embodiments when the dipole layer 94 comprises lanthanum oxide ($La_2O_3$), the metal-containing precursor comprises La(fAMD)$_3$, the oxygen-containing precursor comprises $H_2O$, and the method 300 is performed at a temperature between about 100° C. and about 450° C. and a pressure between about 0.01 Torr and about 50 Torr.

In some embodiments when the dipole layer 94 comprises yttrium oxide ($Y_2O_3$), the metal-containing precursor comprises Y(DPfAMD)$_3$, the oxygen-containing precursor comprises $H_2O$, and the method 300 is performed at a temperature between about 100° C. and about 450° C. and a pressure between about 0.01 Torr and about 50 Torr.

In some embodiments when the dipole layer 94 comprises zinc oxide (ZnO), the metal-containing precursor comprises DEZn, the oxygen-containing precursor comprises $O_3$, and the method 300 is performed at a temperature between about 100° C. and about 450° C. and a pressure between about 0.01 Torr and about 50 Torr.

In some embodiments when the dipole layer 94 comprises gallium oxide ($Ga_2O$ or $Ga_2O_3$), the metal-containing precursor comprises TDMAGa, the oxygen-containing precursor comprises $O_3$, and the method 300 is performed at a temperature between about 100° C. and about 450° C. and a pressure between about 0.1 Torr and about 50 Torr.

Figure 18B:
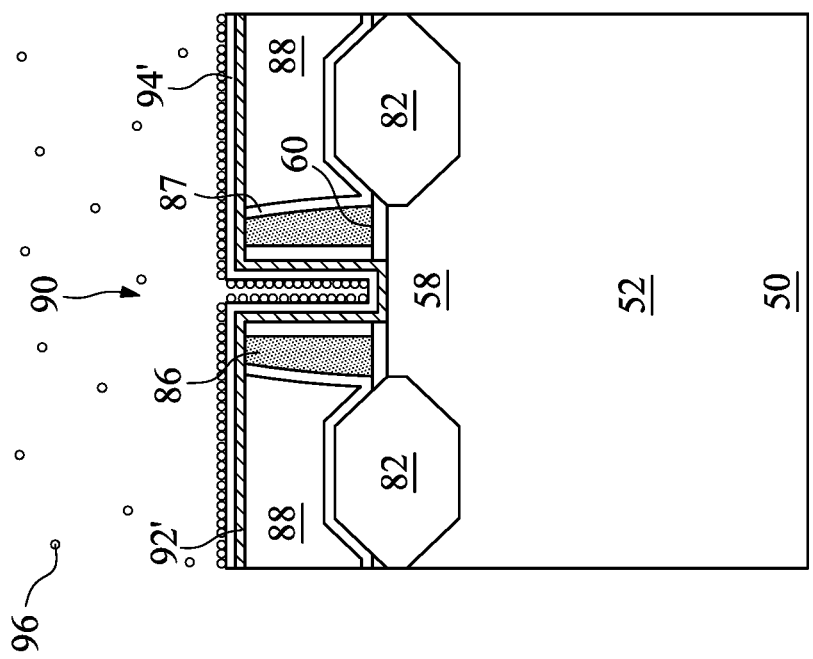
Figure 18A:
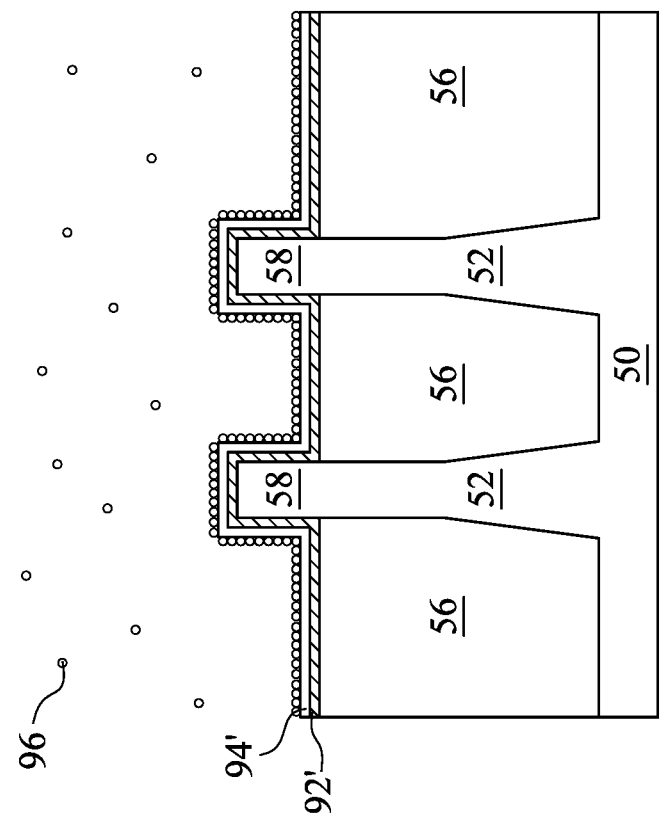

Referring to FIGS. 14, 18A, and 18B, in step 206, a fluorine soaking process is performed on the dipole layer 94 (see FIGS. 16A and 16B) to form a fluorine-doped dipole layer 94'. In some embodiments, the fluorine soaking process comprises soaking the structure of FIGS. 16A and 16B in a fluorine-containing chemical. The fluorine-containing chemical may comprise $WF_6$, $NF_3$, the like, or a combination thereof. In some embodiments, the fluorine soaking process comprises a gas-phase process and the structure of FIGS. 16A and 16B is soaked in gas of fluorine-containing molecules 96 of the fluorine-containing chemical. In some embodiments, the fluorine-containing molecules 96 are adsorbed on an exposed surface of the dipole layer 94 (see FIGS. 16A and 16B) and fluorine atoms from the fluorine-containing molecules 96 are diffused into the dipole layer 94 to form the fluorine-doped dipole layer 94'. In other embodiments, the fluorine soaking process comprises a liquid-phase process. In some embodiments, during the fluorine soaking process, some of metal atoms of the fluorine-doped dipole layer 94' further diffuse into the metal-doped interfacial layer 92'.

In some embodiments, the fluorine soaking process is performed a temperature between about 250° C. and about 550° C. In some embodiments, the fluorine soaking process is performed at a pressure between about 0.5 Torr and about 40 Torr. In some embodiments, a fluorine concentration in the fluorine-doped dipole layer 94' may be increased by increasing a duration of the fluorine soaking process. In some embodiments, the fluorine soaking process is performed for a time between about 0.1 sec and about 1800 sec. In some embodiments, the fluorine-doped dipole layer 94' has a fluorine concentration between about 0.01 at % and about 25 at %.

Figure 19B:
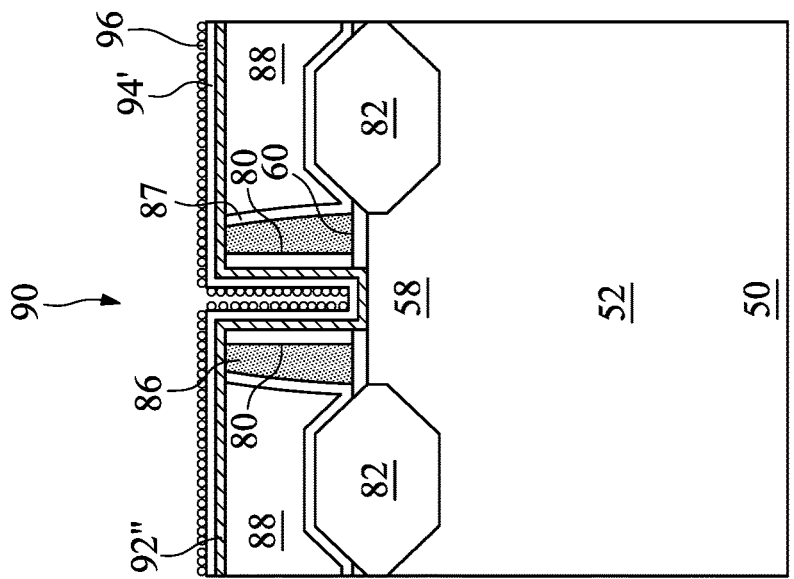
Figure 19A:
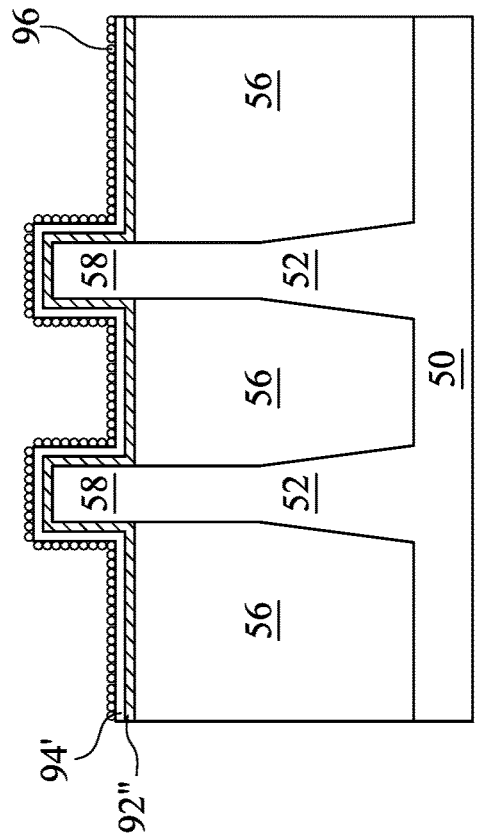

Referring to FIGS. 14, 19A, and 19B, in step 208, an anneal process is performed on the structure of FIGS. 18A and 18B. In some embodiments, the anneal process drives some of fluorine and metal atoms from the fluorine-doped dipole layer 94' into the metal-doped interfacial layer 92' (see FIGS. 18A and 18B) to form a metal/fluorine-doped interfacial layer 92". In some embodiment when the fluorine-doped dipole layer 94' is a fluorine-doped lanthanum oxide ($La_2O_3$) layer, the metal atoms are lanthanum (La) atoms. In some embodiment when the fluorine-doped dipole layer 94' is a fluorine-doped yttrium oxide ($Y_2O_3$) layer, the metal atoms are yttrium (Y) atoms. In some embodiment when the fluorine-doped dipole layer 94' is a fluorine-doped zinc oxide (ZnO) layer, the metal atoms are zinc (Zn) atoms. In some embodiment when the fluorine-doped dipole layer 94' is a fluorine-doped aluminum oxide ($Al_2O_3$) layer, the metal atoms are aluminum (Al) atoms. In some embodiment when the fluorine-doped dipole layer 94' is a fluorine-doped gallium oxide ($Ga_2O$ or $Ga_2O_3$) layer, the metal atoms are gallium (Ga) atoms. In some embodiments, the anneal process is performed at a temperature between about 450° C. and about 1100° C. In some embodiments, the anneal process is performed for a time between about 0.1 sec and about 30 sec. In some embodiments, steps 206 and 208 are performed N1 times. N1 may be between about 1 and about 5.

In some embodiments, a diffusion depth of fluorine and metal atoms within the metal/fluorine-doped interfacial layer 92" may be increased by increasing a temperature, and/or a duration of the anneal process. In some embodiments when the anneal process is performed for a time between about 0.1 sec and about 1800 sec, fluorine and metal atoms are diffused to an upper surface of the metal/fluorine-doped interfacial layer 92". In such embodiments, the upper surface of the metal/fluorine-doped interfacial layer 92" has a fluorine concentration between about 0.001 at % and about 20 at %. Furthermore, in some embodiments when the fluorine-doped dipole layer 94' comprises fluorine-doped lanthanum oxide (La2O$_3$), the upper surface of the metal/fluorine-doped interfacial layer 92" has a lanthanum concentration between about 0.001 at % and about 15 at %.

In some embodiments when the anneal process is performed for a time between about 0.1 sec and about 1800 sec, fluorine and metal atoms are diffused to an interface between the metal/fluorine-doped interfacial layer 92" and a respective fin 52. In such embodiments, the upper surface of the metal/fluorine-doped interfacial layer 92" has a fluorine concentration between about 0.001 at % and about 20 at %, an interior of the metal/fluorine-doped interfacial layer 92" has a fluorine concentration between about 0.001 at % and about 20 att %, and the interface between the metal/fluorine-doped interfacial layer 92" and the respective fin 52 has a fluorine concentration between about 0.001 at % and about 20 at %. Furthermore, in some embodiments when the fluorine-doped dipole layer 94' comprises fluorine-doped lanthanum oxide ($La_2O_3$), the upper surface of the metal/fluorine-doped interfacial layer 92" has a lanthanum concentration between about 0.001 at % and about 15 at %, the interior of the metal/fluorine-doped interfacial layer 92" has a lanthanum concentration between about 0.001 at % and about 15 at %, and the interface between the metal/fluorine-doped interfacial layer 92" and the respective fin 52 has a lanthanum concentration between about 0.001 at % and about 15 at %.

In some embodiments, the metal atoms diffused into the interfacial layer 92" may introduce energy states close to a conduction band edge, which may lead to leakage path and reliability weakness of the resulting gate stack. In some embodiments, the fluorine atoms diffused into the interfacial layer 92" may remove the energy states close to conduction band edge, improve gate stack reliability, and reduce or eliminate gate leakage.

Referring to FIGS. 14, 20A, and 20B, in step 210, the fluorine-doped dipole layer 94' (see FIGS. 19A and 19B) is removed to expose the metal/fluorine-doped interfacial layer 92". In some embodiments, the removal process may comprise a wet etch process, such as a dilute hydrofluoric acid (dHF) etch, SC1 process, SC2 process, the like, or a combination thereof.

Figure 21B:
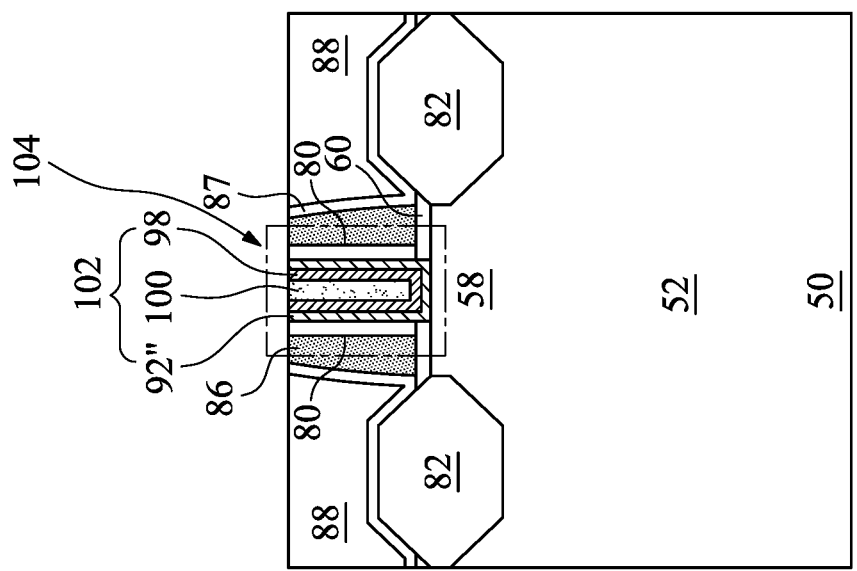
Figure 21A:
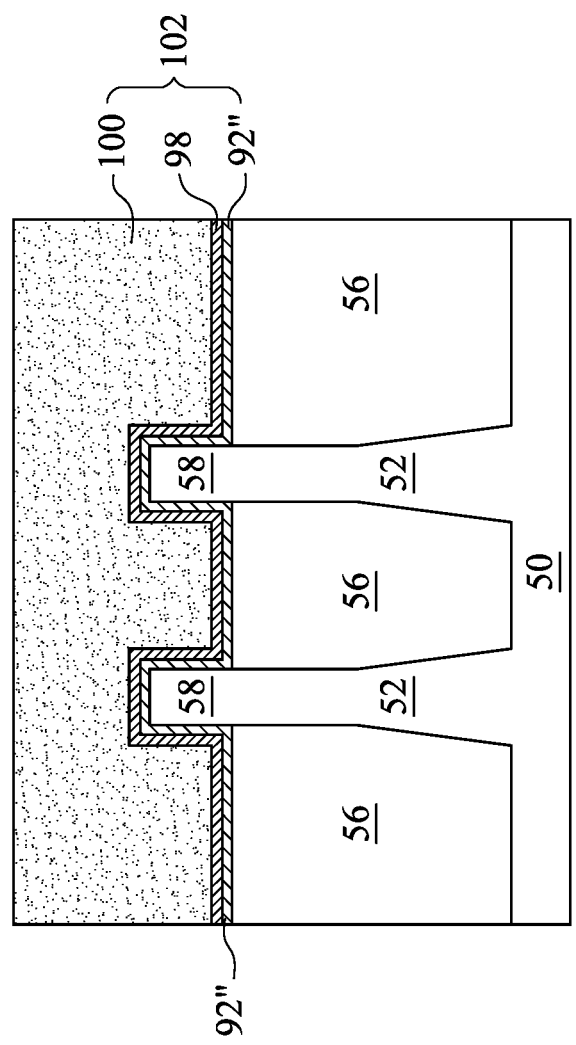

Referring to FIGS. 14, 21A, and 21B, in step 212, a gate dielectric layer 98 is formed over the metal/fluorine-doped interfacial layer 92" in the openings 90 (see FIGS. 20A and 20B). In some embodiments, the gate dielectric layer 98 comprises silicon oxide, silicon nitride, or multilayers thereof. In some embodiments, the gate dielectric layer 98 includes a high-k dielectric material, and in these embodiments, the gate dielectric layer 98 may have a k value greater than about 7.0, and may include a metal oxide or a silicate of hafnium, aluminum, zirconium, lanthanum, manganese, barium, titanium, lead, and combinations thereof. The formation methods of the gate dielectric layer 98 may include Molecular-Beam Deposition (MBD), ALD, PECVD, a combination thereof, or the like. In some embodiments, the gate dielectric layer 98 comprises atoms of a first metallic element and the metal/fluorine-doped interfacial layer 92" comprises atoms of a second metallic element different from the first metallic element.

Figure 21C:
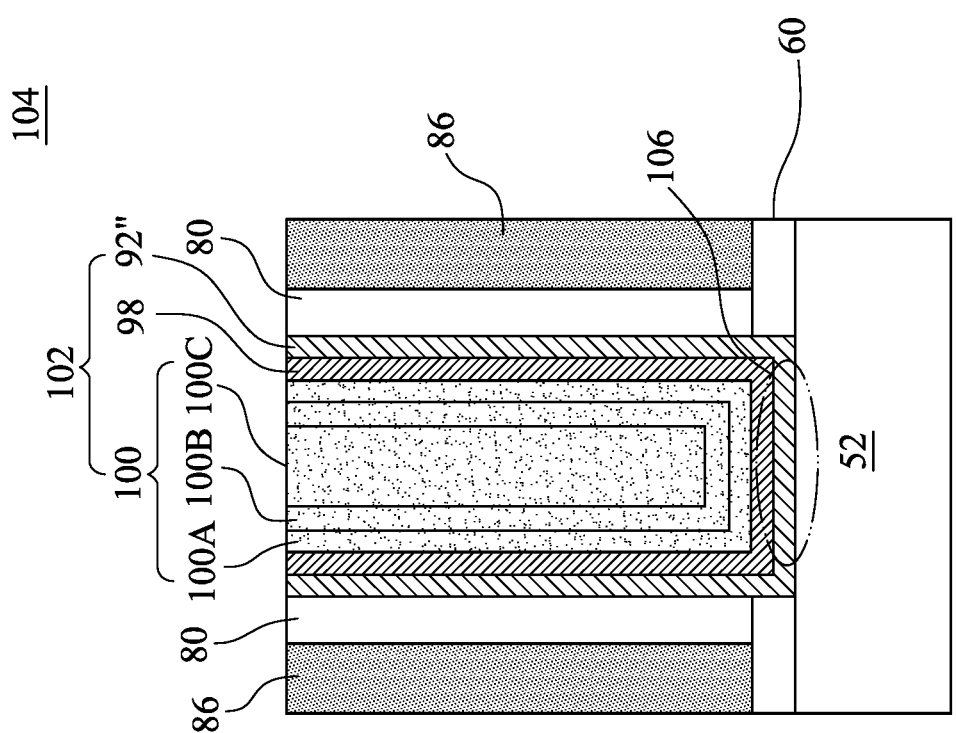

Referring further to FIGS. 14, 21A, and 21B, in step 214, the gate electrode layer 100 is deposited over the gate dielectric layer 98 and fills the remaining portions of the openings 90 (see FIGS. 20A and 20B). Although a single layer gate electrode layer 100 is illustrated in FIGS. 21A and 21B, the gate electrode layer 100 may comprise any number of liner layers 100A, any number of work function tuning layers 100B, and a conductive fill layer 100C as illustrated by FIG. 21C, which shows a detailed view of a region 104 of FIG. 21B. The liner layers 100A may include TiN, TiO, TaN, TaC, combinations thereof, multi-layers thereof, or the like, and may be formed using PVD, CVD, ALD, a combination thereof, or the like. In region 50N, the work function tuning layers 100B may include Ti, Ag, Al, TiAl, TiAlN, TiAlC, TaC, TaCN, TaSiN, TaAlC, Mn, Zr, combinations thereof, multi-layers thereof, or the like, and may be formed using PVD, CVD, ALD, a combination thereof, or the like. In region 50P, the work function tuning layers 100B may include TiN, WN, TaN, Ru, Co, combinations thereof, multi-layers thereof, or the like, and may be formed using PVD, CVD, ALD, a combination thereof, or the like. In some embodiments, the conductive fill layer 100C may comprise Co, Ru, Al, Ag, Au, W, Ni, Ti, Cu, Mn, Pd, Re, Ir, Pt, Zr, alloys thereof, combinations thereof, multi-layers thereof, or the like, and may be formed using PVD, CVD, ALD, plating, a combination thereof, or the like.

After the filling of the openings 90 (see FIGS. 20A and 20B), a planarization process, such as a CMP, may be performed to remove the excess portions of the gate dielectric layer 98, the gate electrode layer 100, and/or the metal/fluorine-doped interfacial layer 92", which excess portions are over the top surface of the first ILD 88. The remaining portions of the gate dielectric layer 98, the gate electrode layer 100, and the metal/fluorine-doped interfacial layer 92" thus form gate stacks 102 of the resulting FinFETs. The gate stacks 102 may extend along sidewalls of channel regions 58 of the fins 52.

Figure 21D:
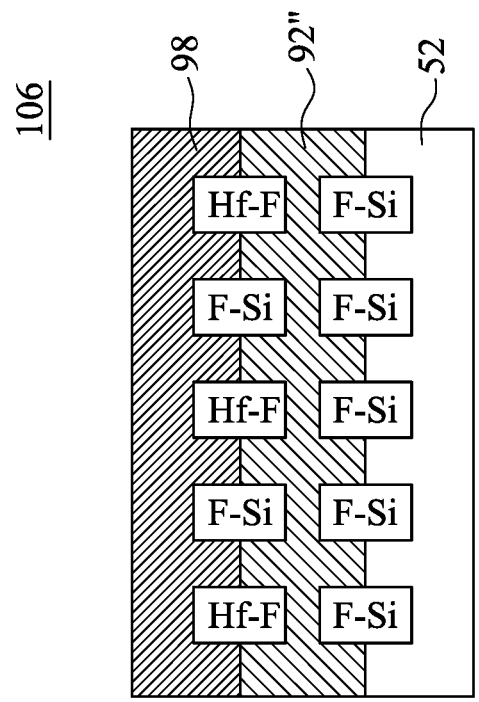

FIG. 21D illustrates a detailed view of a region 106 of FIG. 21C. In some embodiments, fluorine atoms within the metal/fluorine-doped interfacial layer 92" diffuse into a respective fin 52 and a respective gate dielectric layer 98 and form various bonds at an interface between the metal/fluorine-doped interfacial layer 92" and the respective fin 52 and an interface between the metal/fluorine-doped interfacial layer 92" and the respective gate dielectric layer 98. In some embodiments, the fluorine atoms form F—Si bonds at the interface between the metal/fluorine-doped interfacial layer 92" and the respective fin 52 and the interface between the metal/fluorine-doped interfacial layer 92" and the respective gate dielectric layer 98. In some embodiments when the gate dielectric layer 98 is made of hafnium oxide ($HfO_2$), the fluorine atoms form Hf—F bonds at the interface between the metal/fluorine-doped interfacial layer 92" and the respective gate dielectric layer 98. The F—Si and Hf—F bonds form strong bonds at the interfaces and improve reliability of the gates stacks 102.

In some embodiments, some of the metal atoms within the metal/fluorine-doped interfacial layer 92" diffuse into the respective gate dielectric layer 98 and the respective fin 52. In some embodiments when the gate dielectric layer 98 is made of hafnium oxide ($HfO_2$) and the metal atoms are lanthanum (La) atoms, a ratio of a lanthanum (La) concentration to a hafnium (Hf) concentration in the gate dielectric layer 98 is between about 0.014 and about 0.4. In some embodiments when the gate dielectric layer 98 is made of hafnium oxide ($HfO_2$), a ratio of a fluorine (F) concentration to a hafnium (Hf) concentration in the gate dielectric layer 98 is between about 0.014 and about 0.4.

The formation of the gate dielectric layers 98 in the region 50N and the region 50P may occur simultaneously such that the gate dielectric layers 98 in each region are formed of the same materials. In other embodiments, the gate dielectric layers 98 in each region may be formed by distinct processes such that the gate dielectric layers 98 in different regions may be formed of different materials. The formation of the conductive fill layers 100C in the region 50N and the region 50P may occur simultaneously such that the conductive fill layers 100C in each region are formed of the same materials. In other embodiments, the conductive fill layers 100C in each region may be formed by distinct processes such that the conductive fill layers 100C in different regions may be formed of different materials. Various masking steps may be used to mask and expose appropriate regions when using distinct processes.

Figure 22B:
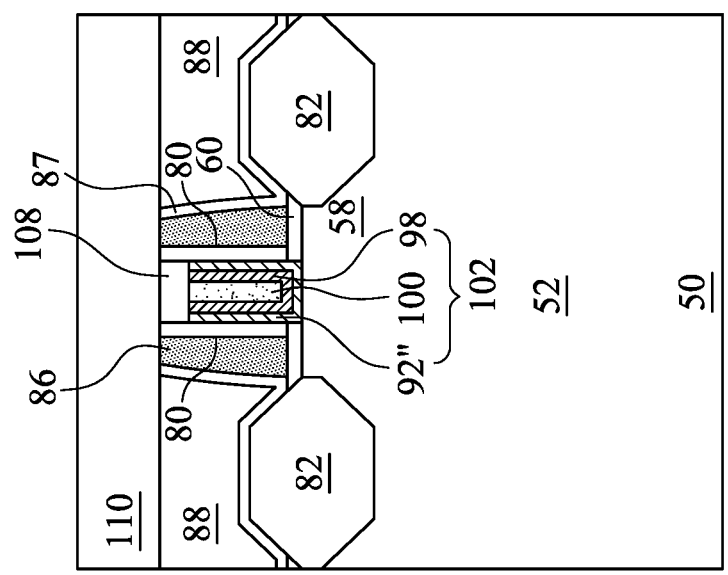
Figure 22A:
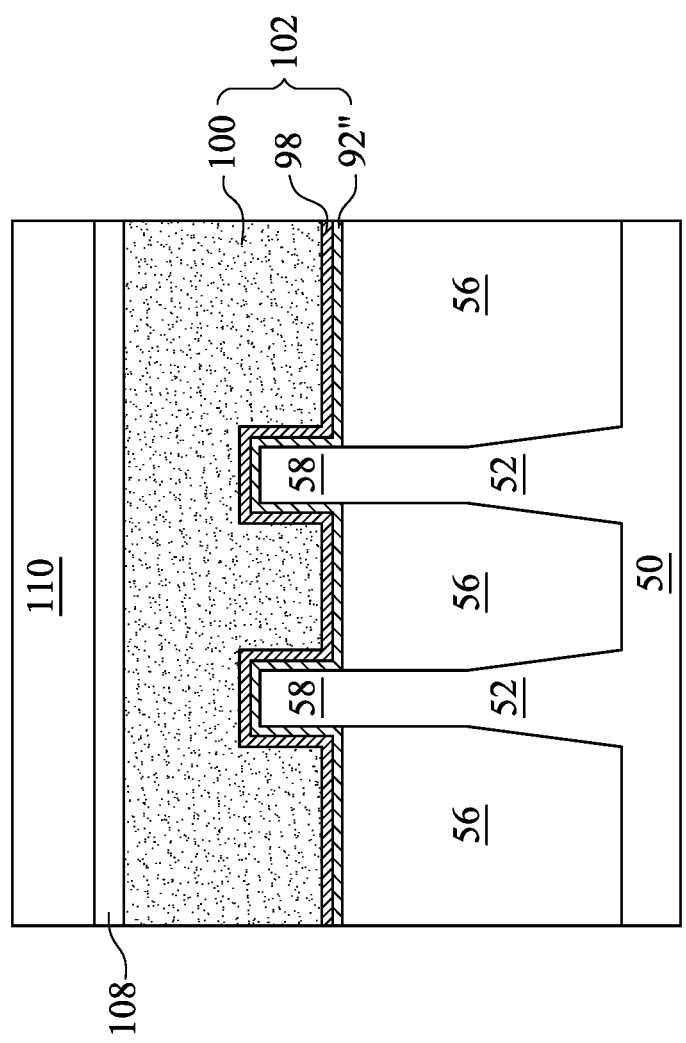

In FIGS. 22A and 22B, after formation of the gate stacks 102, a second ILD 110 is deposited over the first ILD 88 and the gate stacks 102. In some embodiments, the second ILD 110 is formed using similar materials and method as the first ILD 88 and the description is not repeated herein. In some embodiments, the first ILD 88 and the second ILD 110 comprise a same material. In other embodiments, the first ILD 88 and the second ILD 110 comprise different materials.

In some embodiments, before the formation of the second ILD 110, the gate stacks 102 are recessed, so that recesses are formed directly over the gate stacks 102 and between opposing portions of gate seal spacers 80. Gate masks 108 comprising one or more layers of a dielectric material, such as silicon nitride, silicon oxynitride, a combination thereof, or the like, are filled in the recesses, followed by a planarization process to remove excess portions of the dielectric material extending over the first ILD 88. The subsequently formed gate contacts 112 (see FIGS. 23A and 23B) penetrate through the respective gate mask 108 to contact the top surface of the respective recessed gate electrode layer 100.

Figure 23B:
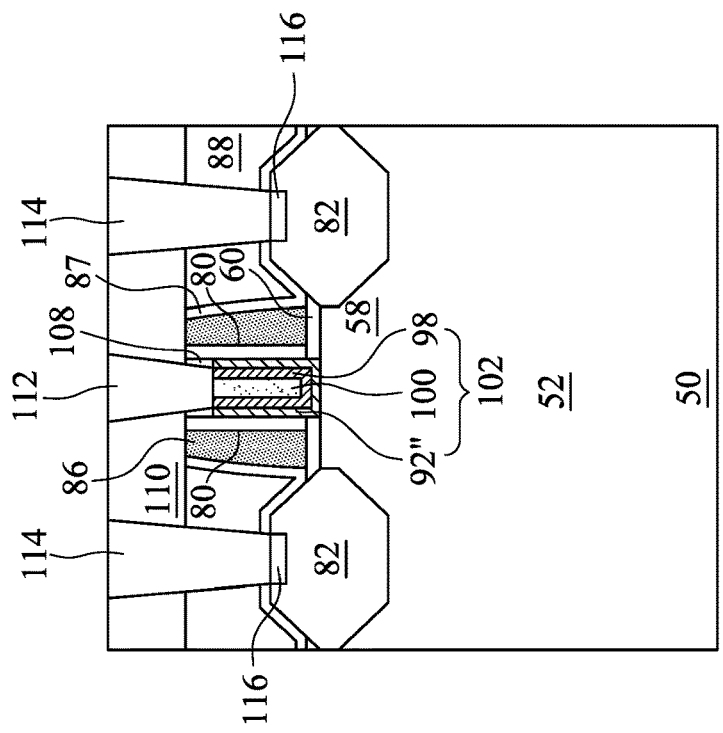
Figure 23A:
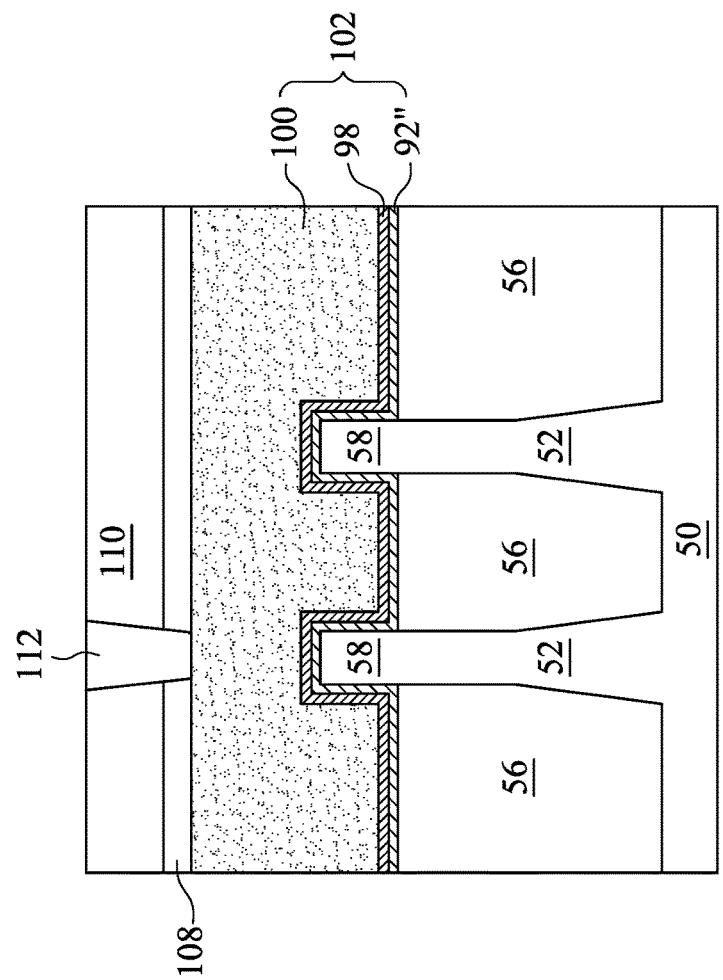

In FIGS. 23A and 23B, gate contacts 112 and source/drain contacts 114 are formed through the second ILD 110 and the first ILD 88 in accordance with some embodiments. Openings for the source/drain contacts 114 are formed through the first ILD 88, the second ILD 110 and the CESL 87, and openings for the gate contacts 112 are formed through the second ILD 110 and the gate masks 108. The openings may be formed using acceptable photolithography and etching techniques. After forming the openings for the source/drain contacts 114, silicide layers 116 are formed through the openings for the source/drain contacts 114. In some embodiments, a metallic material is deposited in the openings for the source/drain contacts 114. The metallic material may comprise Ti, Co, Ni, NiCo, Pt, NiPt, Ir, PtIr, Er, Yb, Pd, Rh, Nb, a combination thereof, or the like, and may be formed using PVD, sputtering, a combination thereof, or the like. Subsequently, an annealing process is performed to form the silicide layers 116. In some embodiments where the epitaxial source/drain regions 82 comprise silicon, the annealing process causes the metallic material to react with silicon to form a silicide of the metallic material at interfaces between the metallic material and the epitaxial source/drain regions 82. After forming the silicide layers 116, unreacted portions of the metallic material are removed using a suitable removal process, such as a suitable etch process, for example.

Subsequently, a liner, such as a diffusion barrier layer, an adhesion layer, or the like, and a conductive material are formed in the openings for the source/drain contacts 114 and in the openings for the gate contacts 112. The liner may include titanium, titanium nitride, tantalum, tantalum nitride, a combination thereof, or the like. The conductive material may include copper, a copper alloy, silver, gold, tungsten, cobalt, aluminum, nickel, a combination thereof, or the like. A planarization process, such as a CMP process, may be performed to remove excess material from a surface of the second ILD 110. The remaining portions of the liner and the conductive material form the source/drain contacts 114 and the gate contacts 112 in the openings. The source/drain contacts 114 are electrically coupled to the respective epitaxial source/drain regions 82, and the gate contacts 112 are electrically coupled to the respective gate electrode layers 100. The source/drain contacts 114 and gate contacts 112 may be formed in different processes, or may be formed in the same process. Although shown as being formed in the same cross-sections, it should be appreciated that each of the source/drain contacts 114 and the gate contacts 112 may be formed in different cross-sections, which may avoid shorting of the contacts.

Figure 24B:
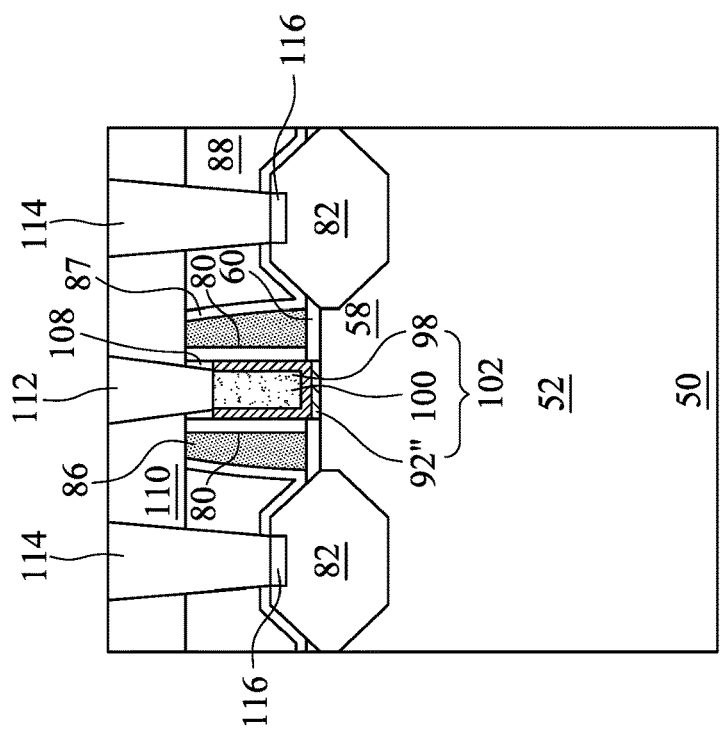
FIGS. 24A and 24B are cross-sectional views of a FinFET device in accordance with some embodiments.
Figure 24A:
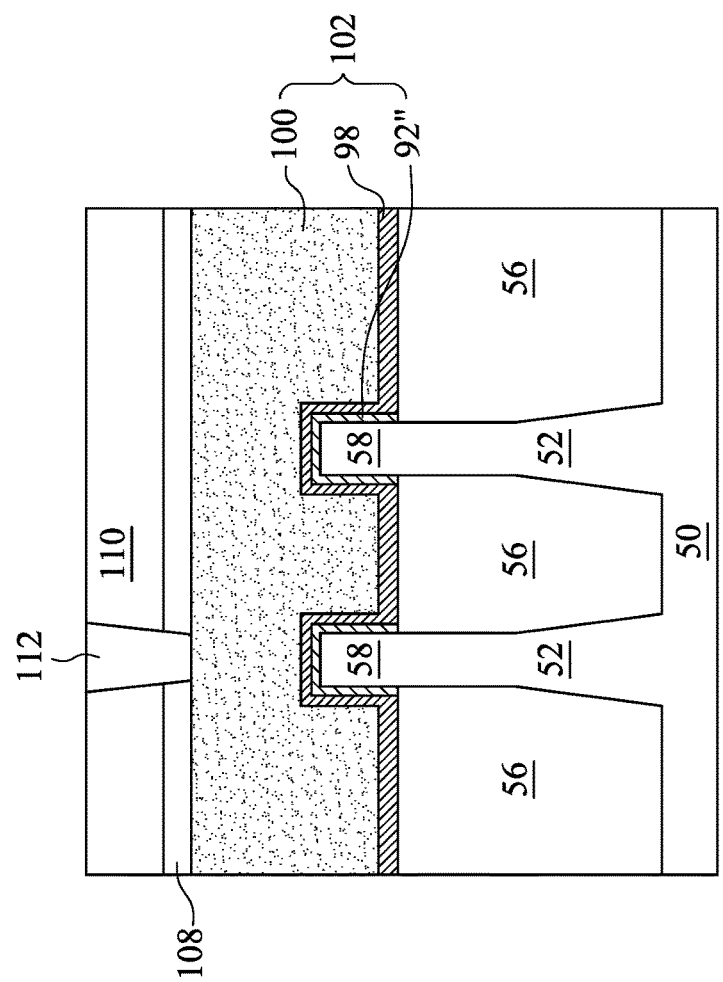

FIGS. 24A and 24B are cross-sectional views of a FinFET device in accordance with some embodiments. FIG. 24A illustrates a cross-sectional view along the reference cross-section A-A illustrated in FIG. 1. FIG. 24B illustrates a cross-sectional view along the reference cross-section B-B illustrated in FIG. 1. In some embodiments, the FinFET device shown in FIGS. 24A and 24B is similar to the FinFET device shown in FIGS. 23A and 23B, with like features being labeled with like numerical references, and descriptions of the like features are not repeated herein. In some embodiments, the FinFET device shown in FIGS. 24A and 24B may be formed using process steps similar to the process steps described above with reference to FIGS. 2, 3, 4, 5, 6, 7, 8A, 8B, 9A, 9B, 10A, 10B, 10C, 10D, 11A, 11B, 12A, 12B, 13A, 13B, 15A, 15B, 16A, 16B, 18A, 18B, 19A, 19B, 20A, 20B, 21A, 21B, 21C, 21D, 22A, 22B, 23A, and 23B, and the description is not repeated herein. In the embodiment illustrated in FIGS. 24A and 24B, the interfacial layers 92" are formed using an oxidation process, such that the interfacial layers 92" extend along surfaces of the fins 52, and do not extend along top surfaces of the isolation regions 56 and sidewalls of the gate seal spacers 80.

The disclosed FinFET embodiments could also be applied to gate-all-around (GAA) device as such as nanostructure (e.g., nanosheet, nanowire, or the like) field effect transistors (NSFETs). In an NSFET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Pat. No. 9,647,071, which is incorporated herein by reference in its entirety. Such NSFET embodiments are illustrated in FIGS. 25A, 25B, 26A, and 26B below.

Figure 25B:
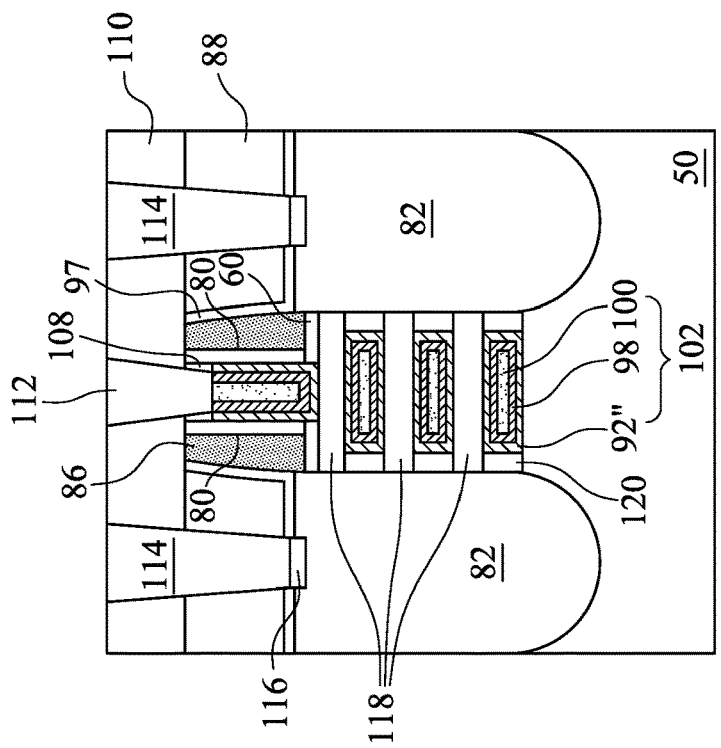
FIGS. 25A and 25B are cross-sectional views of an NSFET device in accordance with some embodiments.
Figure 25A:
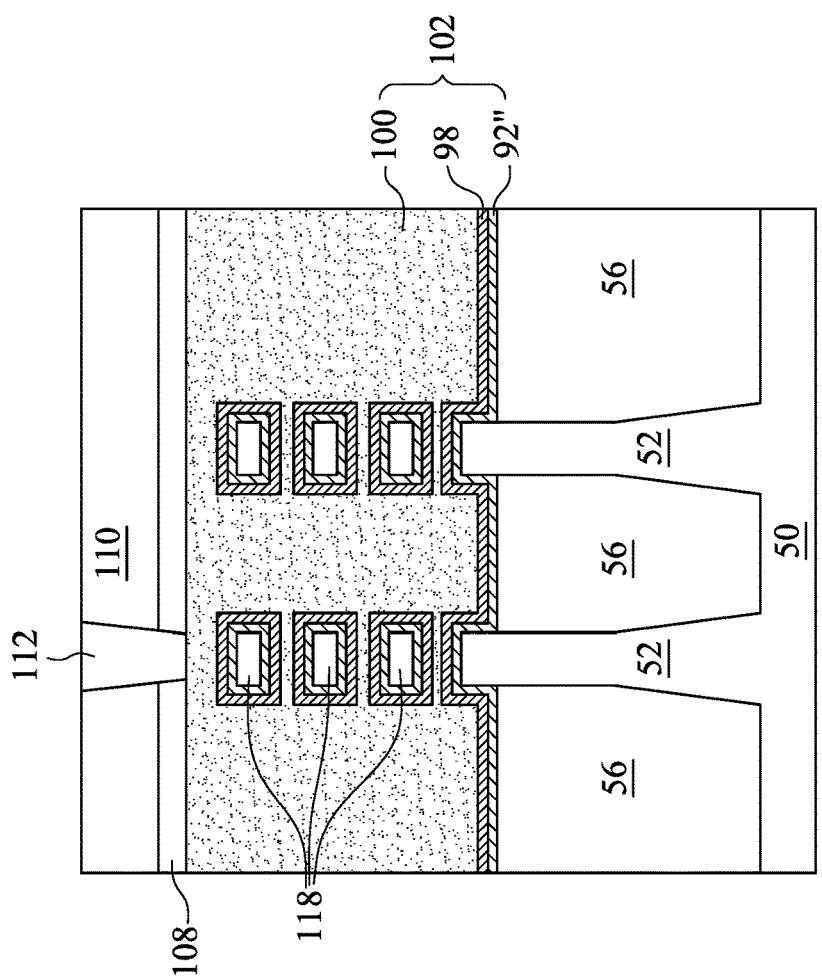

FIGS. 25A and 25B are cross-sectional views of an NSFET device in accordance with some embodiments. FIG. 25A illustrates a cross-sectional view along the reference cross-section A-A illustrated in FIG. 1. FIG. 25B illustrates a cross-sectional view along the reference cross-section B-B illustrated in FIG. 1. The structure illustrated in FIGS. 25A and 25B is similar to the structure illustrated in FIGS. 23A and 23B, with like features being labeled by like numerical references, and descriptions of the like features are not repeated herein. Instead of the fins 52 (see FIGS. 23A and 23B), the structure illustrated in FIGS. 25A and 25B comprises nanostructures 118, such that portions of the gate stacks 102 wrap around the nanostructures 118. In some embodiments, the portions of the gate stacks 102 that wrap around the nanostructures 118 are isolated from adjacent epitaxial source/drain regions 82 by spacers 120. In some embodiments, the nanostructures 118 may be formed using similar materials as the substrate 50 and the description is not repeated herein. In some embodiments, the nanostructures 118 and the substrate 50 comprise a same material. In other embodiments, the nanostructures 118 and the substrate 50 comprise different materials. The spacers 120 may comprise a material such as silicon nitride or silicon oxynitride, although any suitable material, such as low-dielectric constant (low-k) materials having a k-value less than about 3.5, may be utilized.

Figure 26A:
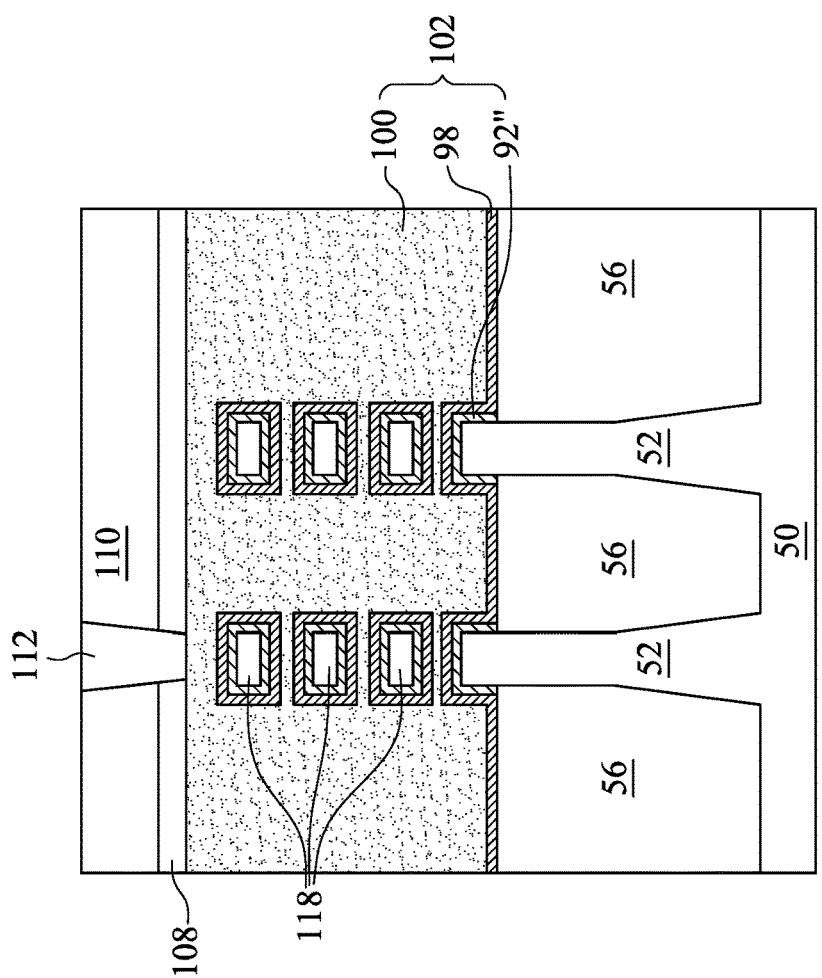
FIGS. 26A and 26B are cross-sectional views of an NSFET device in accordance with some embodiments.
Figure 26B:
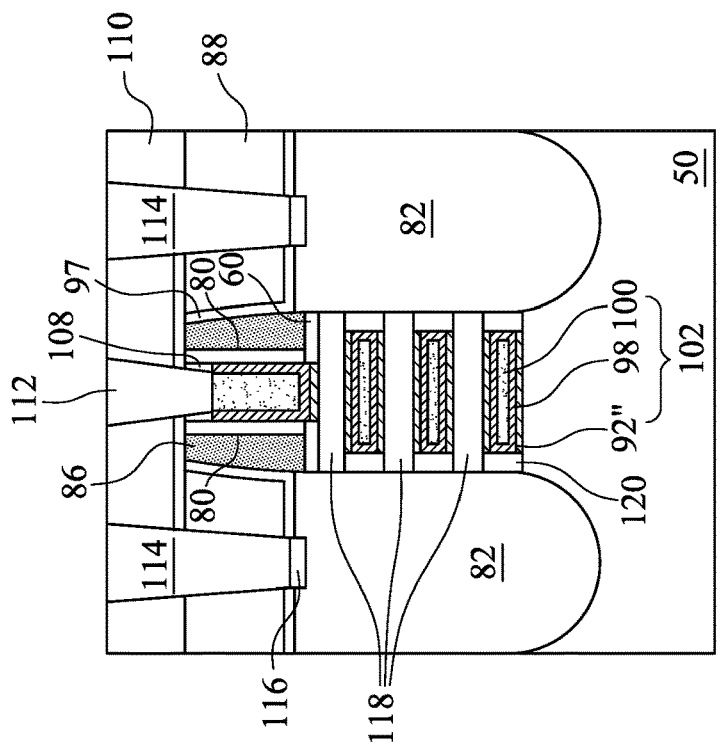

FIGS. 26A and 26B are cross-sectional views of an NSFET device in accordance with some embodiments. FIG. 26A illustrates a cross-sectional view along the reference cross-section A-A illustrated in FIG. 1. FIG. 26B illustrates a cross-sectional view along the reference cross-section B-B illustrated in FIG. 1. The structure illustrated in FIGS. 26A and 26B is similar to the structure illustrated in FIGS. 24A and 24B, with like features being labeled by like numerical references, and descriptions of the like features are not repeated herein. Instead of the fins 52 (see FIGS. 24A and 24B), the structure illustrated in FIGS. 26A and 26B comprises nanostructures 118, such that portions of the gate stacks 102 wrap around the nanostructures 118. In some embodiments, the portions of the gate stacks 102 that wrap around the nanostructures 118 are isolated from adjacent epitaxial source/drain regions 82 by spacers 120. In some embodiments, the nanostructures 118 may be formed using similar materials as the substrate 50 and the description is not repeated herein. In some embodiments, the nanostructures 118 and the substrate 50 comprise a same material. In other embodiments, the nanostructures 118 and the substrate 50 comprise different materials. The spacers 120 may comprise a material such as silicon nitride or silicon oxynitride, although any suitable material, such as low-dielectric constant (low-k) materials having a k-value less than about 3.5, may be utilized.

Embodiments may achieve advantages. By doping the interfacial layers with metal and fluorine atoms as described above, a threshold voltage ($V_t$) of a semiconductor device is improved (or reduced), reliability of a gate stack is improved, and gate leakage is reduced or eliminated.

In accordance with an embodiment, a method includes forming a fin extending from a substrate. A dummy gate is formed over the fin. The dummy gate extends along sidewalls and a top surface of the fin. The dummy gate is removed to form a recess. A replacement gate is formed in the recess. Forming the replacement gate includes forming an interfacial layer along sidewalls and a bottom of the recess. A dipole layer is formed over the interfacial layer. The dipole layer includes metal atoms. Fluorine atoms are incorporated in the dipole layer. The fluorine atoms and the metal atoms are driven from the dipole layer into the interfacial layer. The dipole layer is removed. In an embodiment, the dipole layer includes a metal oxide material. In an embodiment, incorporating the fluorine atoms in the dipole layer includes soaking the dipole layer in a fluorine-containing chemical. In an embodiment, the fluorine-containing chemical includes $WF_6$ or $NF_3$. In an embodiment, driving the fluorine atoms and the metal atoms from the dipole layer into the interfacial layer includes performing an anneal process. In an embodiment, removing the dipole layer includes etching the dipole layer. In an embodiment, forming the dipole layer includes performing an atomic layer deposition (ALD) process.

In accordance with another embodiment, a method includes patterning a substrate to form a fin. A dummy gate is formed over the fin. The dummy gate extends along sidewalls and a top surface of the fin. The dummy gate is etched to form a recess. A replacement gate is formed in the recess. Forming the replacement gate includes depositing an interfacial layer along sidewalls and a bottom of the recess. A dipole layer is deposited over the interfacial layer. The dipole layer includes metal atoms. A fluorine soaking process is performed on the dipole layer to form a doped dipole layer. The doped dipole layer includes fluorine atoms. An anneal process is performed to drive the fluorine atoms and the metal atoms from the doped dipole layer into the interfacial layer and form a doped interfacial layer. The doped dipole layer is etched to expose the doped interfacial layer. A gate dielectric layer is deposited over the doped interfacial layer. A gate electrode layer is deposited over the gate dielectric layer. In an embodiment, the dipole layer includes lanthanum oxide, yttrium oxide, zinc oxide, aluminum oxide, or gallium oxide. In an embodiment, the anneal process drives some of the fluorine atoms and some of the metal atoms to an interface between the doped interfacial layer and the fin. In an embodiment, the interfacial layer includes silicon oxide. In an embodiment, the fluorine soaking process and the anneal process are performed two or more times. In an embodiment, performing the fluorine soaking process on the dipole layer includes soaking the dipole layer in $WF_6$ or $NF_3$. In an embodiment, the metal atoms are lanthanum atoms, yttrium atoms, zinc atoms, aluminum atoms, or gallium atoms.

In accordance with yet another embodiment, a device includes a fin extending from a substrate, and an isolation structure over the substrate and adjacent the fin. A top surface of the fin is above a top surface of the isolation structure. The device further includes a gate stack extending along the top surface and sidewalls of the fin and the top surface of the isolation structure. The gate stack includes an interfacial layer along the top surface and the sidewalls of the fin, and a gate dielectric layer over the interfacial layer. The interfacial layer includes a dielectric material doped with atoms of a first metallic element and fluorine atoms. An interface between the interfacial layer and the fin includes F—Si bonds. The gate dielectric layer includes atoms of a second metallic element. An interface between the interfacial layer and the gate dielectric layer includes bonds between some of the atoms of the second metallic element and some of the fluorine atoms. In an embodiment, the first metallic element is lanthanum, yttrium, zinc, aluminum, or gallium. In an embodiment, the dielectric material includes silicon oxide. In an embodiment, the first metallic element is different from the second metallic element. In an embodiment, the gate dielectric layer includes hafnium oxide ($HfO_2$), and the interface between the interfacial layer and the gate dielectric layer includes Hf—F bonds. In an embodiment, the gate dielectric layer is a metal/fluorine-doped layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a fin extending from a substrate;
   forming a dummy gate over the fin, the dummy gate extending along sidewalls and a top surface of the fin;
   removing the dummy gate to form a recess; and
   forming a replacement gate in the recess, wherein forming the replacement gate comprises:
   forming an interfacial layer along sidewalls and a bottom of the recess;
   forming a dipole layer over the interfacial layer, the dipole layer comprising metal atoms;
   incorporating fluorine atoms in the dipole layer;
   driving the fluorine atoms and the metal atoms from the dipole layer into the interfacial layer; and
   removing the dipole layer.

2. The method of claim 1, wherein the dipole layer comprises a metal oxide material.

3. The method of claim 1, wherein incorporating the fluorine atoms in the dipole layer comprises soaking the dipole layer in a fluorine-containing chemical.

4. The method of claim 3, wherein the fluorine-containing chemical comprises $WF_6$ or $NF_3$.

5. The method of claim 1, wherein driving the fluorine atoms and the metal atoms from the dipole layer into the interfacial layer comprises performing an anneal process.

6. The method of claim 1, wherein removing the dipole layer comprises etching the dipole layer.

7. The method of claim 1, wherein forming the dipole layer comprises performing an atomic layer deposition (ALD) process.

8. A method comprising:
   patterning a substrate to form a fin;
   forming a dummy gate over the fin, the dummy gate extending along sidewalls and a top surface of the fin;
   etching the dummy gate to form a recess; and
   forming a replacement gate in the recess, wherein forming the replacement gate comprises:
   depositing an interfacial layer along sidewalls and a bottom of the recess;
   depositing a dipole layer over the interfacial layer, the dipole layer comprising metal atoms;
   performing a fluorine soaking process on the dipole layer to form a doped dipole layer, the doped dipole layer comprising fluorine atoms;
   performing an anneal process to drive the fluorine atoms and the metal atoms from the doped dipole layer into the interfacial layer and form a doped interfacial layer;
   etching the doped dipole layer to expose the doped interfacial layer;
   depositing a gate dielectric layer over the doped interfacial layer; and
   depositing a gate electrode layer over the gate dielectric layer.

9. The method of claim 8, wherein the dipole layer comprises lanthanum oxide, yttrium oxide, zinc oxide, aluminum oxide, or gallium oxide.

10. The method of claim 8, wherein the anneal process drives some of the fluorine atoms and some of the metal atoms to an interface between the doped interfacial layer and the fin.

11. The method of claim 8, wherein the interfacial layer comprises silicon oxide.

12. The method of claim 8, wherein the fluorine soaking process and the anneal process are performed two or more times.

13. The method of claim 8, wherein performing the fluorine soaking process on the dipole layer comprises soaking the dipole layer in $WF_6$ or $NF_3$.

14. The method of claim 8, wherein the metal atoms are lanthanum atoms, yttrium atoms, zinc atoms, aluminum atoms, or gallium atoms.

15. A method comprising:
    forming an interfacial layer over a channel region;
    forming a dipole layer over the interfacial layer, the dipole layer comprising metal atoms;
    incorporating fluorine atoms into the dipole layer to form a fluorine-doped dipole layer;
    driving fluorine atoms and metal atoms from the fluorine-doped dipole layer into the interfacial layer;
    removing remaining portions of the fluorine-doped dipole layer; and
    after removing remaining portions of the fluorine-doped dipole layer, forming a gate electrode over the interfacial layer.

16. The method of claim 15, wherein the fluorine-doped dipole layer has a fluorine concentration between about 0.01 at % and about 25 at %.

17. The method of claim 15, wherein after removing remaining portion of the fluorine-doped dipole layer, the interfacial layer has fluorine concentration between about 0.001 att % and about 20 att %.

18. The method of claim 15, wherein driving fluorine atoms and metal atoms into the interfacial layer drives some of the fluorine atoms and some of the metal atoms to bottom surface of the interfacial layer.

19. The method of claim 15, wherein incorporating fluorine atoms into the dipole layer is performed at least in part by soaking the dipole layer in $WF_6$ or $NF_3$.

20. The method of claim 15, wherein driving fluorine atoms and metal atoms into the interfacial layer is performed at least in part by an anneal.

* * * * *